United States Patent
Fong et al.

(10) Patent No.: US 9,831,065 B2
(45) Date of Patent: Nov. 28, 2017

(54) COMPUTATION OF STATISTICS FOR STATISTICAL DATA DECIMATION

(71) Applicant: Lam Research Corporation, Fremont, CA (US)

(72) Inventors: Andrew S. Fong, Castro Valley, CA (US); John C. Valcore, Jr., Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 85 days.

(21) Appl. No.: 15/046,324

(22) Filed: Feb. 17, 2016

(65) Prior Publication Data

US 2016/0172162 A1 Jun. 16, 2016

Related U.S. Application Data

(63) Continuation of application No. 14/086,883, filed on Nov. 21, 2013, now Pat. No. 9,295,148.

(Continued)

(51) Int. Cl.
*H03H 7/00* (2006.01)
*H01J 37/32* (2006.01)
*H05H 1/46* (2006.01)

(52) U.S. Cl.
CPC .. *H01J 37/32183* (2013.01); *H01J 37/32091* (2013.01); *H01J 37/3299* (2013.01);
(Continued)

(58) Field of Classification Search
CPC ........... H01J 37/32183; H01J 37/32091; H01J 37/32935; H01J 37/3299; H05H 1/46
See application file for complete search history.

(56) References Cited

U.S. PATENT DOCUMENTS 4,353,777 A 10/1982 Jacob
4,457,820 A 7/1984 Bergeron et al.
(Continued)

FOREIGN PATENT DOCUMENTS

CN 101110347 A 1/2008
CN 101295345 10/2008
(Continued)

OTHER PUBLICATIONS

Steuer, Christoph, Tool Comparison at GC Stack Etch in LAM TCP Using Plasma Parameters (SEERS), Dec. 12, 2000, 2nd workshop on self excited electron plasma resonance spectroscopy, Dresden, Germany.

(Continued)

*Primary Examiner* — Tung X Le
*Assistant Examiner* — Raymond R Chai
(74) *Attorney, Agent, or Firm* — Martine Penilla Group, LLC

(57) ABSTRACT

Systems and methods for statistical data decimation are described. The method includes receiving a variable from a radio frequency (RF) system, propagating the variable through a model of the RF system, and counting an output of the model for the variable to generate a count. The method further includes determining whether the count meets a count threshold, generating a statistical value of the variable at the output of the model upon determining that the count meets the count threshold, and sending the statistical value to the RF system to adjust the variable.

21 Claims, 13 Drawing Sheets

Related U.S. Application Data

(60) Provisional application No. 61/737,623, filed on Dec. 14, 2012.

(52) U.S. Cl.
CPC .. *H01J 37/32926* (2013.01); *H01J 37/32935* (2013.01); *H05H 1/46* (2013.01); *H05H 2001/4682* (2013.01)

(56) References Cited

U.S. PATENT DOCUMENTS

| | | | |
|---|---|---|---|
| 4,504,799 A | 3/1985 | Elmis et al. | |
| 4,855,897 A | 8/1989 | Shinskey | |
| 5,053,725 A | 10/1991 | Gesche et al. | |
| 5,571,366 A | 11/1996 | Ishii et al. | |
| 5,989,999 A | 11/1999 | Levine et al. | |
| 6,157,867 A | 12/2000 | Hwang et al. | |
| 6,222,718 B1 * | 4/2001 | Dible | G01N 33/6848 361/234 |
| 6,417,732 B1 * | 7/2002 | Radomski | H03F 1/345 330/207 P |
| 6,431,112 B1 | 8/2002 | Sill et al. | |
| 6,441,555 B1 | 8/2002 | Howald et al. | |
| 6,781,317 B1 | 8/2004 | Goodman | |
| 7,361,287 B2 | 4/2008 | Laermer | |
| 7,586,100 B2 * | 9/2009 | Raj | C23C 14/48 118/620 |
| 7,764,140 B2 | 7/2010 | Nagarkatti et al. | |
| 8,040,068 B2 | 10/2011 | Coumou et al. | |
| 8,053,991 B2 | 11/2011 | Kim et al. | |
| 8,103,492 B2 | 1/2012 | Brcka | |
| 8,679,358 B2 | 3/2014 | Nakagawa | |
| 2003/0119308 A1 | 6/2003 | Geefay et al. | |
| 2005/0039682 A1 | 2/2005 | Dhindsa et al. | |
| 2005/0057165 A1 | 3/2005 | Goodman | |
| 2005/0205532 A1 | 9/2005 | Patrick et al. | |
| 2005/0264218 A1 | 12/2005 | Dhindsa et al. | |
| 2006/0005928 A1 | 1/2006 | Howald et al. | |
| 2006/0054596 A1 | 3/2006 | Howard | |
| 2007/0095788 A1 | 5/2007 | Hoffman et al. | |
| 2007/0127188 A1 | 6/2007 | Yang et al. | |
| 2008/0029385 A1 | 2/2008 | Koshimizu et al. | |
| 2008/0074255 A1 | 3/2008 | Park et al. | |
| 2008/0241016 A1 | 10/2008 | Kato et al. | |
| 2009/0210181 A1 | 8/2009 | Swank | |
| 2009/0255800 A1 | 10/2009 | Koshimizu | |
| 2009/0308734 A1 * | 12/2009 | Krauss | H01J 37/32935 204/192.13 |
| 2010/0039747 A1 | 2/2010 | Sansoni et al. | |
| 2010/0136793 A1 | 6/2010 | Chen et al. | |
| 2010/0248488 A1 | 9/2010 | Agarwal et al. | |
| 2010/0258246 A1 | 10/2010 | Iwakoshi et al. | |
| 2010/0332201 A1 | 12/2010 | Albarede et al. | |
| 2011/0139748 A1 | 6/2011 | Donnelly et al. | |
| 2012/0000887 A1 * | 1/2012 | Eto | H01J 37/321 216/61 |
| 2012/0052689 A1 | 3/2012 | Tokashiki | |
| 2012/0098614 A1 * | 4/2012 | Boston | H03H 7/40 333/17.3 |
| 2012/0187844 A1 | 7/2012 | Hoffman et al. | |
| 2012/0227484 A1 | 9/2012 | Chen et al. | |
| 2012/0262064 A1 | 10/2012 | Nagarkatti et al. | |
| 2013/0122711 A1 | 5/2013 | Marakhtanov et al. | |
| 2013/0180951 A1 | 7/2013 | Indrakanti et al. | |
| 2014/0062303 A1 | 3/2014 | Hoffman et al. | |
| 2014/0066838 A1 | 3/2014 | Hancock | |
| 2014/0076713 A1 | 3/2014 | Valcore, Jr. et al. | |
| 2014/0305589 A1 | 10/2014 | Valcore, Jr. et al. | |
| 2015/0002018 A1 | 1/2015 | Lill et al. | |

FOREIGN PATENT DOCUMENTS

| | | |
|---|---|---|
| JP | 2002-063999 | 2/2002 |
| JP | 2003-282545 | 10/2003 |
| WO | 9914699 A1 | 3/1999 |
| WO | 2008036210 A2 | 3/2008 |
| WO | 2014070838 A1 | 5/2014 |

OTHER PUBLICATIONS

Christoph, Lars, Comparison of Applied Materials DPS Chambers used for poly-Si Etch process by Plasma Parameters, Dec. 6, 2000, 2nd workshop on self excited electron plasma resonance spectroscopy, Dresden, Germany.

* cited by examiner

COMPUTATION OF STATISTICS FOR STATISTICAL DATA DECIMATION

CLAIM OF PRIORITY

This application is a continuation application and claims the benefit of and priority under 35 U.S.C. §120 to co-pending U.S. application Ser. No. 14/086,883, filed on Nov. 21, 2013, and titled "Computation of Statistics for Statistical Data Decimation", which claims the benefit of and priority under 35 U.S.C. §119(e) to U.S. Provisional Patent Application No. 61/737,623, filed on Dec. 14, 2012, and titled "Methods of Computation of Statistics For Statistical Data Decimation", all of which are hereby incorporated by reference in their entirety.

FIELD

The present embodiments relate to performing statistical data determination and use of a statistical value in a plasma system.

BACKGROUND

In a plasma system, a radio frequency (RF) signal is generated by a generator. The signal is transferred to a plasma reactor to generate plasma within the plasma reactor. The plasma formed in the plasma reactor is used for a variety of applications, e.g., clean a wafer, deposit materials on the wafer, etch the wafer, etc.

It is desirable to control properties of the plasma to control the applications. For example, it is desirable to control plasma uniformity to achieve an etch rate. As another example, it is desirable to control power of the plasma to achieve a deposition rate.

To control a property, the property is measured using a sensor in the plasma system.

It is in this context that embodiments described in the present disclosure arise.

SUMMARY

Embodiments of the disclosure provide apparatus, methods and computer programs for generating a statistical value to reduce an amount of data associated with a model within a plasma system. It should be appreciated that the present embodiments can be implemented in numerous ways, e.g., a process, an apparatus, a system, a device, or a method on a computer-readable medium. Several embodiments are described below.

In some embodiments, a statistical value is used to control a plasma chamber or to generate an RF signal. For example, instead of analyzing all values of a variable at an output of a computer-generated model to control a plasma chamber, a statistical value is generated from the values and it is determined whether the statistical value is within a pre-determined range. Upon determining that the statistical value is within the pre-determined range, the plasma chamber is not controlled, e.g., an RF signal being supplied to the plasma chamber is not modified, etc. On the other hand, upon determining that the statistical value is outside the pre-determined range, the plasma chamber is controlled using the statistical value, e.g., an RF signal supplied to the plasma chamber is generated based on the statistical value, etc.

In various embodiments, a method includes receiving a variable from a radio frequency (RF) system, propagating the variable through a model of the RF system, and counting an output of the model for the variable to generate a count. The method further includes determining whether the count meets a count threshold, generating a statistical value of the variable at the output of the model upon determining that the count meets the count threshold, and sending the statistical value to the RF system to adjust the variable.

In various embodiments, a method includes receiving data associated with a variable from a radio frequency (RF) generator. The RF generator is configured for generating an RF signal to be supplied via an impedance matching circuit to a plasma chamber. The variable is associated with an RF system, which includes the RF generator, impedance matching circuit, and the plasma chamber. The method further includes generating values at an output of a computer-generated model based on the received data, counting an amount of the values output from the computer-generated model, determining whether the amount exceeds a count threshold, generating a statistical value from the values output from the computer-generated model in response to determining that the amount exceeds the count threshold, and sending the statistical value to the RF generator to adjust the RF signal produced by the RF generator.

In some embodiments, a method includes receiving data associated with a variable from a radio frequency (RF) generator. The RF generator is used for generating an RF signal to be supplied via an impedance matching circuit to a plasma chamber. The variable is associated with an RF system, which includes the RF generator, impedance matching circuit, and the plasma chamber. The method includes generating values at an output of a computer-generated model based on the received data, counting an amount of the values output from the computer-generated model, determining whether the amount exceeds a count threshold, generating a statistical value from the values output from the computer-generated model in response to determining that the amount exceeds the count threshold, determining whether the statistical value is outside a pre-determined range, adjusting the statistical value to be within the pre-determined range in response to determining that the statistical value is outside the pre-determined range, and sending the adjusted statistical value to the RF generator to control the RF generator to adjust the RF signal produced by the RF generator.

In a number of embodiments, a method includes receiving data associated with a variable from a radio frequency (RF) generator. The RF generator is used for generating an RF signal to be supplied via an impedance matching circuit to a plasma chamber. The variable is associated with an RF system, which includes the RF generator, impedance matching circuit, and the plasma chamber. The method further includes generating values at an output of a computer-generated model based on the received data, counting an amount of the values output from the computer-generated model, determining whether the amount exceeds a count threshold, and generating a statistical value from the values output from the computer-generated model in response to determining that the amount exceeds the count threshold. The method includes determining whether the statistical value is outside a pre-determined extent, generating an indication of a fault in response to determining that the statistical value is outside the pre-determined extent, and sending the fault indication to the RF generator.

Some advantages of one or more embodiments described in the present disclosure include use of a statistical value instead of all values of a variable at an output of a computer-generated model to control a plasma chamber. For example, instead of determining whether the values are within a pre-determined range, it is determined whether a statistical value is within the pre-determined range. Upon determining that the statistical value is within the pre-determined range, no change is made to further control the plasma chamber. On the other hand, upon determining that the statistical value is outside the pre-determined range, a change is made to the statistical value to control the plasma chamber to achieve the changed statistical value.

The use of the statistical value instead of all the values at an output of a computer-generated model saves processing costs associated with processing the values. For example, instead of using a number of servers, e.g., a server farm, etc., to process the values to generate a statistical value and to control the plasma chamber based on the values, a number of processors, e.g. one, two, etc. is sufficient to generate the statistical value and to control the plasma chamber based on the statistical value.

Other advantages of one or more embodiments described in the present disclosure include decimating data received after generating a statistical value of a variable. The decimation of the data creates empty locations within a storage device of a host controller. The empty locations are used to receive more data regarding a variable associated with a plasma system.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for performing statistical data decimation. It will be apparent that the present embodiments may be practiced without some or all of these specific details. In other instances, well known process operations have not been described in detail in order not to unnecessarily obscure the present embodiments.

Figure 1:
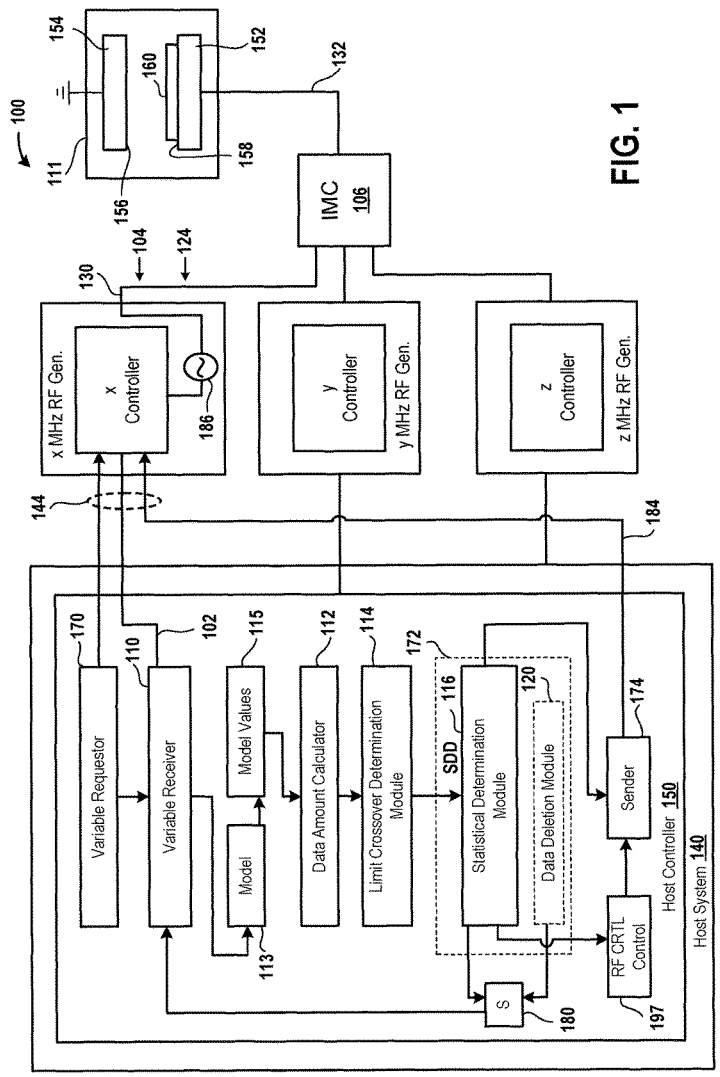
FIG. 1 is a block diagram of a plasma system for generating a statistical value of a variable, in accordance with an embodiment described in the present disclosure.

FIG. 1 is a block diagram of an embodiment of a plasma system 100 for generating a statistical value of a variable. The plasma system 100 includes a host system 140, an x megahertz (MHz) radio frequency (RF) generator, a y MHz RF generator, and a z MHz RF generator. Each RF generator includes a controller. For example, the x MHz RF generator includes an x controller, the y MHz RF generator includes a y controller, and the z MHz RF generator includes a z controller. Examples of x MHz, y MHz, or z MHz include 2 MHz, 27 MHz, and 60 MHz. In some embodiments, x MHz is 2 MHz, y MHz is 27 MHz, and z MHz is 60 MHz. Moreover, the host system 140 includes a host controller 150.

In some embodiments, a controller includes a processor and a storage device. In several embodiments, a processor is a central processing unit (CPU), or a microprocessor, or an application specific integrated circuit (ASIC), or a programmable logic device (PLD), etc. Examples of a storage device include a read-only memory (ROM), a random access memory (RAM), or a combination thereof. In various embodiments, a storage device is a flash memory, or a redundant array of storage disks (RAID), or a hard disk, etc.

The x controller is coupled to the host system 140 via a cable 144, which includes a serial connection, or a parallel connection, or a parallel serial parallel interface (PSPI). Similarly, the y MHz RF generator is coupled to the host system via a cable and the z MHz RF generator is coupled to the host system 140 via a cable. Each cable coupling an RF generator to the host system 140 includes a serial connection, or a parallel connection, or a parallel serial parallel interface (PSPI).

The plasma system 100 further includes an impedance matching circuit 106 and a plasma chamber 111. The impedance matching circuit 106 is connected to the plasma chamber 111 via an RF transmission line 132. In some embodiments, a portion of the RF transmission line 132 includes an RF cable that is surrounded by an insulator that is surrounded by an RF tunnel and another portion of the RF transmission line 132 leading to a chuck 152 is surrounded by an RF cylinder.

The impedance matching circuit matches an impedance of a load connected to the impedance matching circuit with that of a source connected to the impedance matching circuit. The source provides RF energy to the load, which consumes the RF energy. Examples of the source include one or more of the x, y, and z RF generators, and one or more of the RF cables coupling the RF generators to the impedance matching circuit 106. In some embodiments, the source includes other devices (not shown), e.g., a filter used to filter an RF signal supplied via an RF cable, etc., of the plasma system 100 that are coupled between the impedance matching circuit 106 and one or more of the x, y, and z MHz RF generators. Examples of the load include the plasma chamber 111 and the RF transmission line 132. Other examples of the load include other devices (not shown), e.g., a filter to filter an RF signal supplied via the RF transmission line 132, etc., of the plasma system 100 that are coupled between the impedance matching circuit 106 and the plasma chamber 111.

The plasma chamber 111 includes the chuck 152, e.g., an electrostatic chuck (ESC), a magnetic chuck, etc., that is connected to the RF transmission line 132. The plasma chamber 111 further includes an upper electrode 154 that faces the chuck 152. For example, a lower surface 156 of the upper electrode 154 is located across and faces an upper surface 158 of the chuck 152. In various embodiments, the upper electrode 154 is grounded. The chuck 152 includes a lower electrode that is made of a metal, e.g., anodized aluminum, alloy of aluminum, etc. Also, the upper electrode 154 is made of a metal, e.g., aluminum, alloy of aluminum, etc.

A work piece 160, e.g., a semiconductor wafer, a semiconductor wafer on which an integrated circuit is developed, etc., is placed on the upper surface 158 for processing of the work piece 160. Examples of processing the work piece 160 include cleaning the work piece 160, or etching the work piece 160, or depositing films, e.g., oxide films, etc., on the work piece 160, or a combination thereof, etc. The integrated circuit developed on the work piece 160 is used in a variety of computing devices, such as, for example, cell phones, tablets, smart phones, computers, laptops, networking equipment, etc.

In some embodiments, the plasma chamber 111 includes other components (not shown), e.g., an upper dielectric ring surrounding the upper electrode 154, an upper electrode extension surrounding the upper dielectric ring, a lower dielectric ring surrounding the chuck 152, a lower electrode extension surrounding the chuck 152, an upper plasma exclusion zone (PEZ) ring, a lower PEZ ring, etc.

In various embodiments, the upper electrode 154 includes one or more holes that are coupled to a central gas feed, e.g., a gas supply line (not shown), etc. The central gas feed receives one or more process gases from a gas source (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 154 is grounded. The lower electrode 152 is coupled to the x MHz RF generator via the impedance matching circuit 106, to the y MHz RF generator via the impedance matching circuit 106, and to the z MHz RF generator via the impedance matching circuit 106.

When the process gas is supplied between the upper electrode 154 and the chuck 152 and when one or more of the x, y, and z MHz RF generators supply one or more RF signal power via the impedance matching circuit 106 to the chuck 152, the process gas is ignited to generate plasma within the plasma chamber 111. For example, the x MHz generator supplies an RF signal 104 via the RF cable 130 to the impedance matching circuit 106. The impedance matching circuit 106 modifies one or more RF signals received from corresponding one or more of the x, y, and z RF generators to generate a modified RF signal and provides the modified RF signal via the RF transmission line 132 to ignite the process gas to generate plasma within a gap between the chuck 152 and the upper electrode 154. As another example, the y MHz RF generator supplies an RF signal via an RF cable that couples the y MHz RF generator to the impedance matching circuit 106 that modifies the RF signal. In this example, the modified RF signal is further sent via the impedance matching circuit 106 and the RF transmission line 132 to the chuck 152 to generate plasma.

During operation of the plasma system 100 to generate plasma, each RF controller receives an amount of data of a variable from a sensor (not shown) that is coupled to a point within the plasma system 100. For example, the x controller receives values of a variable from a voltage and current probe that is connected to the RF cable 130. As another example, the y controller receives values of a variable from a voltage and current probe that is connected to the RF cable that connects the y MHz RF generator to the impedance matching circuit 106. As another example, the y controller receives values of a variable from a voltage probe that is connected to the RF transmission line 132. As yet another example, the z controller receives values of an optical sensor that is optically coupled to the plasma via a window within the plasma chamber.

Examples of a variable include power of an RF signal at a point of the plasma system 100, or power of plasma, or frequency of the RF signal, or real portion of load impedance, or imaginary portion of the load impedance, or a voltage magnitude at the point, or a current magnitude at the point, or a phase between a complex voltage and a complex current at the point, or a wafer bias at the point, or ion energy at the point, or plasma potential at the point, or a complex current at the point, or a complex voltage at the point, or load impedance at the point, or a combination thereof.

Examples of a load impedance include an impedance of one or more components of the plasma system 100. For example, a load impedance is an impedance at a point within the plasma system 100. As another example, a load impedance is an impedance of one or more of the RF cable 130, the RF cable coupling the y MHz RF generator to the impedance matching circuit 106, the RF cable coupling the z MHz RF generator to the impedance matching circuit 106, the impedance matching circuit 106, the RF transmission line 132, and the plasma chamber 111.

In some embodiments, a point within the plasma system 100 includes a point at an output of the x MHz RF generator, or a point at an output of the y MHz RF generator, or a point at an output of the z MHz RF generator, or a point on the RF cable 130, or a point on the RF cable coupling the y MHz RF generator to the impedance matching circuit 106, or a point on the RF cable coupling the z MHz RF generator to the impedance matching circuit 106, or a point at an input of the impedance matching circuit 106, or a point at an output of the impedance matching circuit 106, or a point on the RF transmission line 132, or a point at the chuck 152.

In various embodiments, an output of the x MHz RF generator is coupled via the RF cable 130 to an input of the impedance matching circuit 106, an output of the y MHz RF generator is coupled via an RF cable to an input of the impedance matching circuit 106, and an output of the z MHz RF generator is coupled via an RF cable to an input the impedance matching circuit 106. In several embodiments, an output of the impedance matching circuit 106 is coupled via the RF transmission line 132 to the chuck 152.

The host controller 150 includes one or more components, e.g., a variable requestor 170, a variable receiver 110, a model 113, a model value generator 115, a data amount calculator 112, a limit crossover determination module 114, a statistical data decimation (SDD) module 172, a switch module 180, an RF control block 197, and a sender 174. The SDD Module 172 includes a statistical determination (SD) module 116 and a data deletion module 120.

In some embodiments, one or more components of a host controller, as described herein, are implemented as a computer program on a non-transitory computer-readable medium, such as, for example, a storage device, etc. In various embodiments, one or more components of a host controller are implemented as hardware, e.g., an application specific integrated circuit, etc. For example, the switching module 180 is a transistor or a group of transistors. In several embodiments, one or more components of a host controller, as described herein, are implemented as a combination of hardware and a computer program.

The variable requester 170 requests via a communication channel of the cable 144 data of a variable from the x controller. In some embodiments, the variable requester 170 sends an address, e.g., a port address, etc., of the variable receiver 110 to the x controller to allow the x controller to sends data of a variable to the variable receiver 110.

In a number of embodiments, the host controller 150 excludes the variable requester 170 and the x controller periodically sends data of a variable to the variable receiver 110. Upon receiving the request, the x controller sends data of a variable via a communication channel 102 of the cable 144 to the variable receiver 110.

In some embodiments, the variable requester 170 and the variable receiver 110 is implemented as one component.

Similarly, in several embodiments, the variable receiver 110 receives data of a variable from a combination of the x controller, the y controller, and the z controller.

The variable receiver 110 receives data of a variable from one or more of the x, y, and z MHz RF generators and sends the data to a model 113. Examples of the model 113 include an RF cable model, or an impedance matching model, or an RF transmission model, or a chuck model, or a combination of the RF cable model and the impedance matching model, or a combination of the RF cable model and the impedance matching model and the RF transmission model, or a combination of the RF cable model and the impedance matching model and the RF transmission model and the chuck model, etc.

A model of a component of a plasma system is a computer-generated model of the component. For example, the RF transmission model is a computer-generated model of the RF transmission line 132 (FIG. 1). As another example, the RF transmission model includes an electrical circuit that includes electrical components, e.g., capacitors, or inductors, etc., of the RF transmission line 132. To illustrate, when the RF transmission line 132 includes an inductor having an inductance of L Henry and a capacitor having a capacitance of C Farad, the RF transmission model includes an inductor having an inductance of L Henry and a capacitor having a capacitance of C Farad. Moreover, in the RF transmission model, components within the electrical circuit are connected in the same manner, e.g., serial, parallel, etc., as that in which electrical components of the electrical circuit of the RF transmission line 132 are connected. For example, when an inductor is connected in parallel with a capacitor within the RF transmission line 132, the RF transmission model includes an inductor connector in parallel with an inductor.

Similarly, the impedance matching model is created based on the impedance matching circuit 106 in a similar manner as that of generating the RF transmission model from the RF transmission line 132. Moreover, the RF cable model is created based on an RF cable, e.g., the RF cable 130 (FIG. 2), etc., in a similar manner as that of generating the RF transmission model from the RF transmission line 132. Also, the chuck model is generated based on the chuck 152 in a similar manner as that of generating the RF transmission model from the RF transmission line 132.

In some embodiments, the model 113 is generated by a processor of a host controller.

Examples of a generating a model are provided in application Ser. No. 13/756,390, filed on Jan. 31, 2013, and titled "Using Modeling to Determine Wafer Bias Associated with a Plasma System", which is incorporated by reference herein in its entirety.

The model value generator 115 generates values of a variable at an output of the model 113 based on the values that are received by the variable receiver 110 and characteristics, e.g., capacitance, or inductance, or impedance, or complex current, or complex current, etc., of the model 113. For example, the model value generator 115 propagates an impedance value that is received from the x controller through components of an RF cable model and an impedance matching model to generate an impedance value at an output of the impedance matching model. In some embodiments, the impedance value that is received from the x controller is an impedance value at an output of the x MHz RF generator. As another example, the model value generator 115 propagates a complex current and voltage value that is received from the y controller via components of an RF cable model, an impedance matching model, and an RF transmission model to generate a complex voltage and current value at an output of the RF transmission model. As yet another example, the model value generator 115 propagates a power value that is received from the y controller via components of an RF cable model, an impedance matching model, an RF transmission model, and a chuck model to generate a complex voltage and current at an output of the chuck model.

In some embodiments, a value of a variable is propagated when a directional sum is calculated of the value and characteristics, e.g., impedance value, power consumption value, voltage value, current value, etc., of a component of a model. An example of a directional sum is provided in application Ser. No. 13/756,390.

In various embodiments, the model value generator 115 generates a value of one variable from values of one or more variables. For example, the model value generator 115 generates a value of a wafer bias at an output of the model 113 from a voltage magnitude of a complex voltage and current at the output, a current magnitude of the complex voltage and current at the output, and a power magnitude of the complex voltage and current at the output. Other examples of generating the wafer bias are provided in application Ser. No. 13/756,390. As another example, the model value generator 115 generates a value of ion energy at an output of the model 113 from a wafer bias at the output and a zero-to-peak voltage at the output. Other examples of generating an ion energy is provided in Application No. 61/799,969, filed on Mar. 15, 2013, and titled, "Using Modeling to Determine Ion Energy Associated with a Plasma System", which is incorporated by reference herein in its entirety.

In some embodiments, for each value received by the variable receiver 110 from one or more of the x, y, and z MHz RF generators, a value at an output of the model 113 is calculated.

Data of a variable at an output of the model 113 is sent from the model value generator 115 to the data amount calculator 112. The data amount calculator 112 counts a number of values of a variable received from the model value generator 115, and sends the count to the limit crossover determination module 114.

In some embodiments, the data amount calculator 112 calculates a number of values of a variable that does not exceed a maximum storage capacity of the variable receiver 110.

The limit crossover determination module 114 determines whether the number of values received from the data amount calculator 112 is greater than a threshold, which is pre-stored in the limit crossover determination module 114. Examples of the threshold include 1000 values, or 10,000 values, or 100,000 values, etc. Other examples of the threshold include 500-1000 values, or 1000-10,000 values, or 10,000-100,000 values, or 100,000-10,00,000 values, or 10,00,000-10,000, 000 values.

Upon determining that the number of values is greater than a threshold, a signal is sent from the limit crossover determination module 114 to the SD module 116 to initiate generation of a statistical value from the values. On the other hand, upon determining that the number of values does not exceed a threshold, a signal is not sent from the limit crossover determination module 114 to the SD module 116 and the SD module 116 does not start generation of a statistical value from the values.

In some embodiments, a threshold is generated based on a storage capacity of a storage device of the host controller 150. For example, when the SD module 116 includes two buffers, each storing n values of a variable, a threshold is n values. When a first one of the two buffers is full, the SD module 116 copies data from the first buffer to a second one of the two buffers and initiates calculation of a statistical value from the data. The SD module 116 calculates a statistical value based on values within the first buffer. After the copying, in various embodiments, data within the first buffer is overwritten with data generated by the model value generator 115.

In several embodiments, instead of the data amount calculator 112, a ratio calculator is located within the host controller 150. The ratio calculator is implemented as a computer program, or a hardware, or a combination thereof. The ratio calculator calculates a ratio of a number of values that are received from the model value generator 115 within a time window to a number of values that are processed by a processor of the host controller 150 within the time window. In these embodiments, the limit crossover determination module 114 determines whether the calculated ratio is greater than a limit, which is pre-stored within a storage device of the limit crossover determination module 114. Upon determining that the calculated ratio is less than the limit, a statistical value is not generated from the values generated by the model value generator 115. On the other hand, upon determining that the calculated ratio is greater than or equal to the limit, a statistical value is generated from the values generated by the model value generator 115.

In some embodiments, a processing speed, which is equal to a number of values processed within a time window, of a processor of the host controller 150 is determined based on several factors, e.g., time taken to access and calculate a statistical value from values received from the model value generator 115, or time taken to achieve a pressure in the plasma chamber 111 after a signal to generate the pressure is sent by the processor, or time taken to sense and receive values of pressure within the plasma chamber 111, or time taken to achieve a temperature in the plasma chamber 111 after a signal to generate the temperature is sent by the processor, or time taken to sense and receive values of temperature within the plasma chamber 111, or time taken to generate a gap between the upper electrode 154 and the chuck 152 in the plasma chamber 111 after a signal to generate the gap is sent by the processor, or time taken to sense and receive values of a gap within the plasma chamber 111, or a combination thereof. For example, a processor of the host controller 150 waits to process a pressure value until the pressure value is sensed by a pressure sensor (not shown) and received by the processor. This wait reduces processing speed of the processor. As another example, a processor of the host controller 150 waits to send a signal to change a gap between the upper electrode 154 and the chuck 152 until a pressure and temperature is achieved within the plasma chamber 111 after a signal to achieve the pressure and temperature is sent by the processor. This wait reduces processing speed of the processor.

The SD module 116 determines a statistical value from data of a variable in response to receiving a signal from the limit crossover determination module 114 that an amount of data of a variable received from the model value generator 115 by the data amount calculator 112 exceeds a threshold. For example, the SD module 116 applies a statistical operation, such as, for example, an insertion sort operation, or a merge sort operation, or a moving interquartile range (IQR) calculation operation, or an interquartile range calculation operation, or a maximum value calculation operation, or a minimum value calculation operation, or a mean value calculation operation, or a median value calculation method, or a variance value calculation method, or a standard deviation value calculation method, or a moving mean value calculation method, or a moving median value calculation method, or a moving variance value calculation method, or a moving standard deviation value calculation method, or a mode, or a moving mode, or a combination thereof, etc., to generate a statistical value from values of a variable.

After generation of a statistical value, the SD module 116 closes the switch module 180 to couple the variable receiver 110 with the data deletion module 120. When the switch module 180 is closed, the data deletion module 120 accesses data stored within a storage device of the data receiver 110 and deletes, e.g., erases, resets, etc., data stored within the storage device to allow the variable receiver 110 to receive and store additional data of a variable from one or more of the x, y, and z controllers. In this manner, a cost associated with implementing a large number of variable receivers for storing a large amount of data is reduced. By deleting data of a variable stored within the variable receiver 110, the variable receiver 110 is used multiple times for storage of data of a variable.

In some embodiments, a statistical value is provided by the SD module 116 to the RF control block 197. The RF control block 197 determines a statistical value of a variable from a statistical value of the variable or of another variable received from the SD module 116. For example, the RF control block 197 determines a statistical value power and/or a statistical value of frequency from a statistical value of a variable received from the SD module 116. As another example, the RF control block 197 determines a statistical value of frequency to be the same as that received from the SD module 116. As another example, the RF control block 197 receives a statistical value of a wafer bias at the output of the model 113, and determines a voltage magnitude of a complex voltage and current at the output, a current magnitude of the complex voltage and current at the output, and a power magnitude of the complex voltage and current at the output. In this example, the voltage magnitude of a complex voltage and current at the output, the current magnitude of the complex voltage and current at the output, and the power magnitude of the complex voltage and current at the output satisfy the value of the wafer bias at the output. As another example, the RF control block 197 receives a statistical value of ion energy at an output of the model 113 and determines a wafer bias value at the output and a zero-to-peak voltage value at the output. In this example, the wafer bias value and the zero-to-peak voltage satisfy the value of the ion energy. The RF control block 197 sends a statistical value of a variable determined by the RF control block 197 to the sender 174.

In various embodiments, the SD module 116 sends a statistical value of a variable to the sender 174 in addition to or without sending the statistical value to the RF control block 197.

The sender 174 sends a statistical value of a variable received from the RF control block 197 and/or from the SD module 116 via corresponding communication channels to one or more of the x, y, and z controllers. For example, the sender 174 sends a statistical value of a variable via a communication channel 184 to the x controller, sends a statistical value of a variable via a communication channel to the y controller, and sends a statistical value of a variable via a communication channel to the z controller. As another example, the sender 174 sends via the communication channel 184 a statistical value of a variable that is generated from data of the variable received from the x controller to the x controller. As yet another example, the sender 174 sends via a communication channel coupled to the y controller a statistical value of a variable that is generated from data of the variable received from the y controller to the y controller.

A controller of an RF generator receives a statistical value of a variable from the sender 174 and provides the statistical value to an RF supply, e.g., an RF supply 186, etc., of the RF generator. The RF supply includes a driver, e.g., a transistors, a group of transistors, etc., that generates an RF signal, e.g., an RF signal 124, etc., having a statistical value of a variable received from the sender 174. The RF signal is amplified by an RF amplifier connected to the driver and is sent via an RF cable that is coupled to the RF amplifier to the impedance matching circuit 106.

The impedance matching circuit 106 matches an impedance of a load with that of a source to modify an RF signal received via an RF cable, e.g., the RF cable 130, etc., from an RF generator to generate an RF signal and sends the modified RF signal via the RF transmission line 132 to the chuck 152. When process gas is supplied within the plasma chamber 111 and the modified RF signal is received by the chuck 152, plasma is generated within the plasma chamber 111. In some embodiments, when plasma is generated before the modified RF signal is received, properties, e.g., impedance, power, frequency, etc., of the plasma are modified upon receiving of the modified RF signal from the impedance matching circuit 106.

In some embodiments, the SD module 116 determines a statistical value from data of a variable received from one or more of the x controller, the y controller, and the z controller.

In a number of embodiments, a number of RF generators other than that shown in FIG. 1 are used. For example, the plasma system 100 includes two RF generators or four RF generators.

It should further be noted that in some embodiments, instead of receiving values of one or more variables from the x, y, and/or z controllers, the host controller 150 receives the values from one or more sensors. The x, y, and/or z controllers do not act as intermediaries between the host controller 150 and the one or more sensors.

In various embodiments, each of the variable requester 170, the variable receiver 110, the model 113, the model value generator 115, the data amount calculator 112, the limit crossover determination module 114, the statistical determination module 116, the switch module 180, the data deletion module 120, the RF control block 197, and the sender 174 are implemented as separate processors. For example, the variable requester 170 is implemented as one processor and the data amount calculator 112 is implemented as another processor.

In a number of embodiments, one or more of the variable requester 170, the variable receiver 110, the model 113, the model value generator 115, the data amount calculator 112, the limit crossover determination module 114, the statistical determination module 116, the switch module 180, the data deletion module 120, the RF control block 197, and the sender 174 are implemented as one processor and any remaining of the variable requester 170, the variable receiver 110, the model 113, the model value generator 115, the data amount calculator 112, the limit crossover determination module 114, the statistical determination module 116, the switch module 180, the data deletion module 120, the RF control block 197, and the sender 174 are implemented as another processor.

In some embodiments, instead of grounding the upper electrode 154, the upper electrode 154 is provided RF power. In various embodiments, instead of grounding the upper electrode 154, the lower electrode of the chuck 152 is grounded and the RF transmission line provided RF power to the upper electrode 154.

In various embodiments, a statistical value is stored in a storage device of the SD module 116. A size of the storage device of the SD module 116 is less than a size of the storage device of the variable receiver 110. For example, the storage device of the SD module 116 includes a single memory location and the storage device of the variable receiver 110 includes multiple memory locations. As another example, the storage device of the SD module 116 includes a lower number of memory locations than that of the storage device of the variable receiver 110.

It should be noted that in some embodiments, the host controller 150 includes a number of processors, e.g., one, two, three, etc., to generate a statistical value and to control the plasma chamber 111 and the number of processors is cost-effective. For example, instead of using a separate processor or a separate server to control the plasma chamber 111, e.g., use one processor to control a temperature within the plasma chamber 111, use another processor to control a gap within the plasma chamber 111, use another processor to control a pressure within the plasma chamber 111, use yet another processor to control a frequency of a signal received by the plasma chamber 111, use still another processor control a power of the signal, or a combination thereof, etc., one processor is used to generate a statistical value and to control the plasma chamber 111. The processor controls the plasma chamber 111 based on a statistical value.

Examples of controlling the plasma chamber 111 include changing a frequency of an RF signal that is generated by an RF generator, or changing a power of the RF signal, or changing a temperature within the plasma chamber 111, or changing a gap within the plasma chamber 111, or changing a pressure within the plasma chamber 111, or a combination thereof.

In some embodiments, a processor of the host controller 150 controls a gas supply valve (not shown) that facilitates supply of a gas from a gas reservoir (not shown) to gas inlets of the upper electrode 154. For example, a processor of the host controller 150 controls a driver, e.g., a transistor, a group of transistors, etc., that supplies a current to open or close the gas supply valve by an amount to control a supply of a gas, e.g., the process gas, etc., to the plasma chamber 111. The control of the supply also allows the processor to control the pressure within the plasma chamber 111 in which the gas is supplied.

In various embodiments, the upper electrode 154 is raised up or down using a motor-driven screw mechanism (not shown). A processor of the host controller 150 controls the motor-driven screw mechanism via a driver, e.g., a transistor, a group of transistors, etc., to move the upper electrode 154 up or down to control, e.g., change, increase, decrease, etc., a gap between the upper electrode 154 and the chuck 152.

In several embodiments, a heater is included within the chuck 152 and the heater is controlled by a processor of the host controller 150 via a driver, e.g., a transistor, a group of transistors, etc., to control, e.g., change, increase, decrease, etc., temperature within the plasma chamber 111.

In a number of embodiments, a heat transfer mechanism, e.g., a duct, etc., is provided within the plasma chamber 111 and a flow of a cooling liquid is controlled by a processor of the host controller 150 via a valve and a driver, e.g., a transistor, a group of transistors, etc., to control temperature within the plasma chamber 111.

Figure 2:
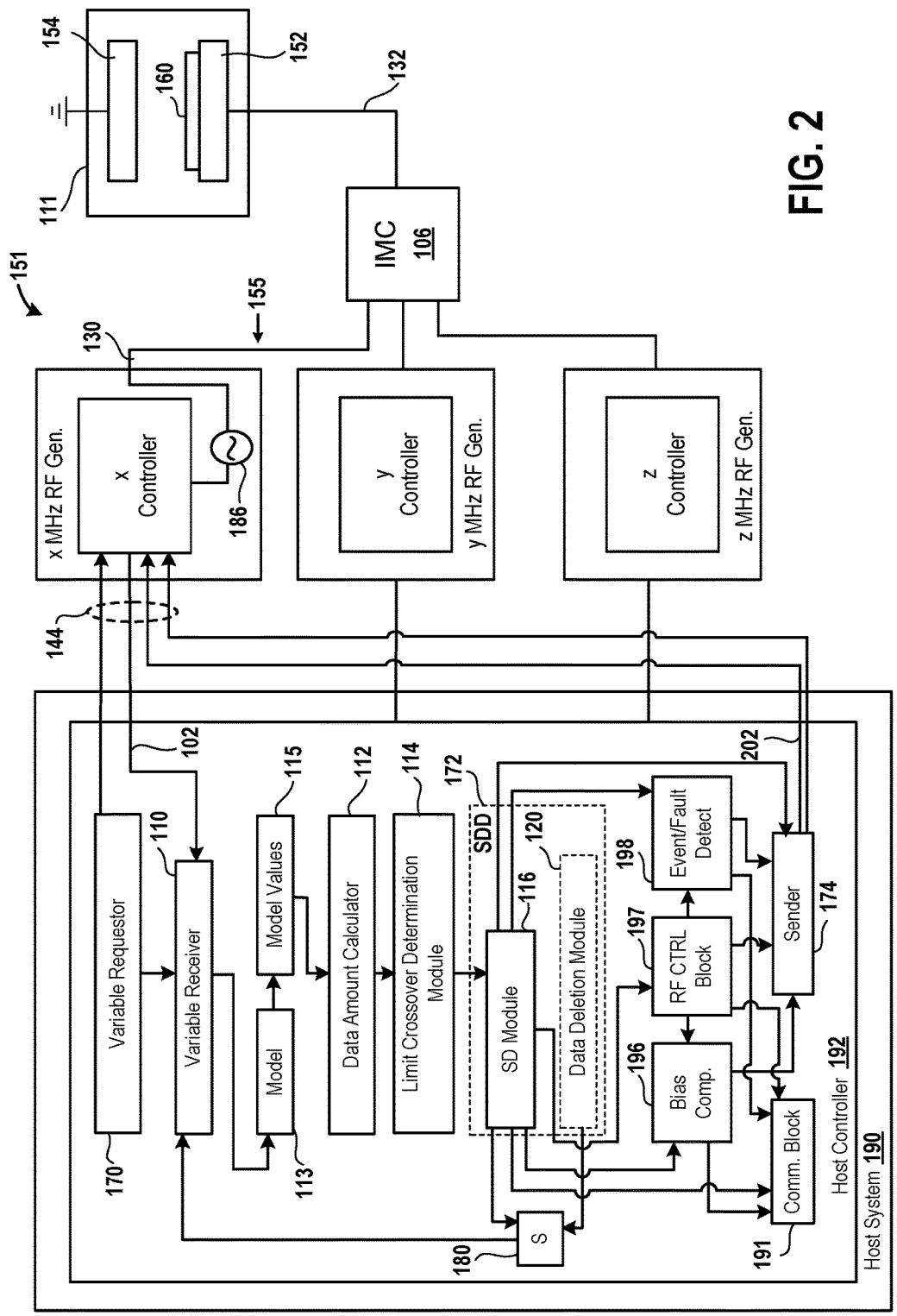
FIG. 2 is a diagram of another plasma system for generating a statistical value of a variable, in accordance with an embodiment described in the present disclosure.

FIG. 2 is a diagram of an embodiment of a plasma system 151 for generating a statistical value of a variable. The plasma system 151 includes the plasma chamber 111, the impedance matching circuit 106, the x, y, and z MHz RF generators, and a host system 190. The host system 190 includes a host controller 192.

In some embodiments, the plasma system 151 is the same as the plasma system 100 (FIG. 1) except that the plasma system 151 includes the host system 190 instead of the host system 140 (FIG. 1). For example, the plasma system 151 is structurally the same as the plasma system 100 (FIG. 1) except that the plasma system 151 includes the host controller 192 instead of the host controller 150 (FIG. 1).

The host controller 192 is the same as the host controller 150 (FIG. 1) except that the host controller 192 includes a bias compensation module 196, an event detection module 198, and a communication block 191. The RF control block 197 is connected to the bias compensation module 196 and the event detection module 198. The SD module 116 is connected to the bias compensation module 196 and the event detection module 198.

The bias compensation module 196 determines whether a statistical value of a variable that is received from the RF control block 197 or from the SD block 116 is within a pre-determined range, which is pre-stored in a storage device of the bias compensation module 196.

In some embodiments, the bias compensation module 196 has a multiple pre-determined ranges for multiple statistical values of a variable. For example, a storage device of the bias compensation module 196 stores a first pre-determined range for a statistical value of a variable that is generated from data of the variable received from the x controller. As another example, a storage device of the bias compensation module 196 stores a second pre-determined range for a statistical value of a variable that is generated from data of the variable received from the y controller. In various embodiments, the first pre-determined range is the same as the second pre-determined range. In some embodiments, the first pre-determined range is different from the second pre-determined range.

Upon determining that a statistical value of a variable is within a pre-determined range, the bias compensation module 196 sends the statistical value to the sender 174, which sends the statistical value via one or more communications links to corresponding one of the x, y, and z controllers. On the other hand, upon determining that a statistical value of a variable is not within a pre-determined range, the bias compensation module 196 adjusts, e.g., modifies, alters, increases, decreases, tunes, etc., the statistical value to be within the pre-determined range and provides the adjusted statistical value to the sender 174.

The sender 174 sends the adjusted statistical value of a variable via one or more communication channels to corresponding one or more of the x, y, and z controllers.

A controller of an RF generator receives an adjusted statistical value of a variable from the sender 174 via a communication channel that couples the controller to the sender 174 and provides the adjusted statistical value to an RF supply of the RF generator. For example, the x controller receives an adjusted statistical value of a variable and provides the adjusted statistical value to the RF supply 186. An RF supply of an RF generator generates an RF signal, e.g., an RF signal 155, etc., that includes the adjusted statistical value. For example, the RF signal 155 has a power of the adjusted statistical value. As another example, the RF signal 155 has a frequency of the adjusted statistical value.

In a manner similar to that described above, the impedance matching circuit 106 receives one or more RF signals from corresponding one or more RF cables that are coupled to corresponding one or more of the x, y, and z MHz RF generators. The impedance matching circuit 106 generates a modified RF signal based on the one or more RF signals received and sends the modified RF signal via the RF cable 132 to the chuck 152. Based on the modified RF signal received, plasma is generated within the plasma chamber 111 or when plasma is already generated at the time of receipt of the modified RF signal, properties of the plasma are modified based on the modified RF signal.

The event detection module 198 receives a statistical value of a variable from the RF control block 197 or from the SD module 116 and determines whether the statistical value is within a pre-determined extent, which is pre-stored in a storage device of the event detection module 198. In some embodiments, a pre-determined extent is the same as a pre-determined range. In various embodiments, a pre-determined extent is a range different from a pre-determined range.

In some embodiments, the event detection module 198 has a multiple pre-determined extents for multiple statistical values of a variable. For example, a storage device of the event detection module 198 stores a first pre-determined extent for a statistical value of a variable that is generated from data of the variable received from the x controller. As another example, a storage device of the event detection module 198 stores a second pre-determined extent for a statistical value of a variable that is generated from data of the variable received from the y controller. In various embodiments, the first pre-determined extent is the same as the second pre-determined extent. In some embodiments, the first pre-determined extent is different from the second pre-determined extent.

Upon determining that a statistical value of a variable is within a pre-determined extent, a fault signal is not generated by the event detection module 198. On the other hand, upon determining that a statistical value of a variable is outside a pre-determined extent, a fault signal is generated by the event detection module 198 and provided to the sender 174.

The sender 174 sends a fault signal via one or more communication channels to corresponding x, y, and z controllers. For example, the sender 174 sends a fault signal via a communication channel 202 to the x controller and sends a fault signal via a communication channel to the y controller.

A controller of an RF generator receives a fault signal and responds to the fault signal. For example, a controller of an RF generator sends a signal to an RF supply of the RF generator to pause generation of an RF signal for sending to the impedance matching circuit 106. As another example, a controller of an RF generator sends a signal to an RF supply of the RF generator to pause generation of an RF signal for sending to the impedance matching circuit 106 until an adjusted statistical value that is compensated for bias is received via the sender 174 from the bias compensation module 196.

In some embodiments, the event detection module 198 sends a fault detection signal via the communication block 191 to a remote computer system for notifying the remote computer system of a fault in a statistical value of a variable. Examples of a communication block 191 include a network interface controller, such as, for example, a network interface adapter or a network interface card.

Examples of the remote computer system include a computer, a server, a processor, a cell phone, a smart phone, a tablet, etc., which is operated by a user. The user views the notification on a display device, e.g., a cathode ray tube display, a liquid crystal display device, a light emitting diode display device, a plasma display device, etc., of the remote computer system and decides to take action to resolve the fault.

In various embodiments, the SD module 116 is connected to the communication block 191 for sending a statistical value of a variable to the remote computer system.

In various embodiments, each of the variable requester 170, the variable receiver 110, the data amount calculator 112, the model 113, the limit crossover determination module 114, the model value generator 115, the statistical determination module 116, the switch module 180, the data deletion module 120, the bias compensation module 196, the event detection module 198, the RF control block 197, the sender 174, and the communication block 191 are implemented as separate processors. For example, the variable requester 170 is implemented as one processor and the data amount calculator 112 is implemented as another processor.

In a number of embodiments, one or more of the variable requester 170, the variable receiver 110, the data amount calculator 112, the model 113, the limit crossover determination module 114, the model value generator 115, the statistical determination module 116, the switch module 180, the data deletion module 120, the bias compensation module 196, the event detection module 198, the RF control block 197, the sender 174, and the communication block 191 are implemented as one processor and any remaining of the variable requester 170, the variable receiver 110, the data amount calculator 112, the model 113, the limit crossover determination module 114, the model value generator 115, the statistical determination module 116, the switch module 180, the data deletion module 120, the bias compensation module 196, the event detection module 198, the RF control block 197, the sender 174, and the communication block 191 are implemented as another processor.

In some embodiments, the host controller 192 excludes the data deletion module 120 and the switch 180. In these embodiments, no decimation is performed in the host system 190. In these embodiments, all values of a variable are stored within one or more storage devices of the host system 190, or sent to the remote computer system for storage via the communication block 191, or sent for storage via the communication block 191 to a virtual machine, etc.

Figure 3:
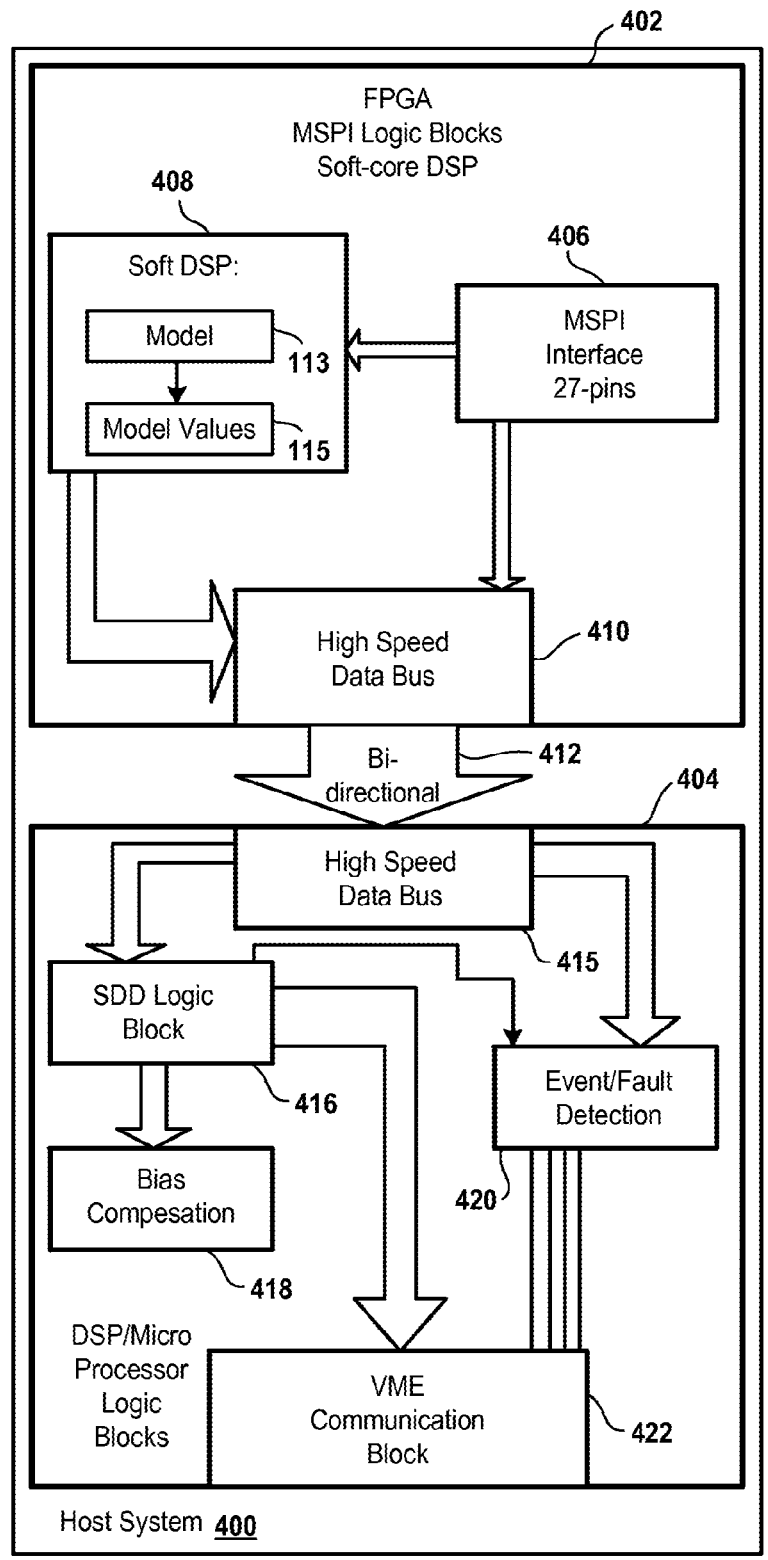
FIG. 3 is a diagram of a host system of the plasma system of FIG. 1 or FIG. 2, in accordance with an embodiment described in the present disclosure.

FIG. 3 is a diagram of an embodiment of a host system 400, which is an example of the host system 190 (FIG. 2). The host system 400 includes a field programmable gate array (FPGA) 402 and a microprocessor 404. It should be noted that instead of the FPGA 402, any other integrated circuit, e.g., an ASIC, etc., may be used. Moreover, instead of the microprocessor 404, any other integrated circuit, e.g., FPGA, ASIC, etc., may be used.

The FPGA 402 includes a multiple serial parallel interface (SPI) (MSPI) 406, which includes one or more PSPIs. The MSPI 406 includes 27 pins, which includes 9 pins each for a PSPI. For example, the MSPI 406 includes a PSPI that is connected to the x controller, a PSPI that is connected to the y controller, and a PSPI that is connected to the z controller (FIG. 2). The MSPI 406 receives data, e.g., power read back from serial data output (SDO) ports of the x, y, and z controllers, frequency read back from SDO ports of the x, y, and z controllers, real portion of plasma impedance read back from SDO ports of the x, y, and z controllers, imaginary portion of plasma impedance read back from SDO ports of the x, y, and z controllers, and other variables, etc., from the PSPIs of the x, y, and z controllers, and sends the data to a soft-core digital signal processor (DSP) 408 and/or to a high-speed port 410.

The soft-core DSP 408 includes the model 113 and the model value generator 115. For example, the FPGA 402 implements an electrical circuit that includes electrical components, e.g., capacitors, or inductors, etc., of the RF transmission line 132. Moreover, the FPGA 402 connects the components within the electrical circuit in the same manner, e.g., serial, parallel, etc., as that in which electrical components of the electrical circuit of the RF transmission line 132 are connected.

Data of variables received by the MSPI 406 are sent from the MSPI 406 to the soft-core DSP 408. The model value generator 115 of the soft-core DSP 408 generates values of variables at an output of the model 113 based on values received from the MSPI 406 and sends the generated values via the high-speed port 410 and a high-speed bus 412 to a high-speed bus port 415 of the microprocessor 404. Examples of a high-speed bus include a bus that transfers data at 500 MHz, or at 400 MHz, or at 300 MHz, or at 600 MHz, or between 5 MHz and 500 MHz, etc. Data of variables is communicated via the high-speed port 415 to an SDD logic block 416, which is an example of the SDD 172 (FIG. 2).

In some embodiments, a logic block is a computer program that is executed by one or more processors, e.g., the SDD logic block 416 is executed by the microprocessor 404. In several embodiments, a logic block is implemented as hardware within an integrated circuit. In various embodiments, a logic block is implemented as a combination of a computer program and hardware.

The SDD logic block 416 applies a statistical transformation to data of variables received via the high-speed port 415 from the soft-core DSP 408 to generate a statistical value. For example, the SDD logic block 416 generates a mean, or a median, or a mode, or a standard deviation, or a maximum, or a minimum, or an interquartile range (IQR), etc., from data of variables received via the high-speed port 415 from the soft-core DSP 408 to generate a statistical value. As another example, the SDD logic block 416 generates a moving mean of multiple values of power received from the soft-core DSP 408. As yet another example, the SDD logic block 416 generates a moving median of multiple values of a real portion of plasma impedance received from the soft-core DSP 408. As another example, the SDD logic block 416 generates a moving IQR, or an IQR, or a maximum value, or a minimum value, or a mean value, or a median value, or a variance, or a standard deviation, or a moving mean, or a moving median, or a moving variance, or a moving standard deviation, or a mode, or a moving mode, or a combination thereof, etc., from data values of variables from the soft-core DSP 408 to generate a statistical value.

In a number of embodiments, the SDD logic block 416 deletes one or more values of a variable received over a time window except for a statistical value of the variable. For example, the SDD logic block 416 erases, from a storage device, within the host system 400, values of imaginary portion of plasma impedance except for a median of the values. As another example, the SDD logic block 416 erases, from a storage device, within the host system 400, values of frequency except for a mode of the values.

In some embodiments, no decimation is performed in the host system 400. In these embodiments, all values of a variable are stored within one or more storage devices of the host system 400, or sent to the remote computer system for storage via a VME communication block 422, or sent for storage via the VME communication block 422 to a virtual machine, etc. Examples of the VME communication block 422 include an Ethernet communication block, an EtherCAT communication block, a Universal Serial Bus (USB) port, a network interface controller, a serial port, and a parallel port. The VME communication block is an example of the communication block 191 (FIG. 2).

A bias compensation module 418, which is an example of the bias compensation module 196 (FIG. 2), determines an amount of bias based on a statistical value received from the SDD logic block 416 to compensate for the bias. For example, upon determining that a statistical value is outside a pre-determined range, the bias compensation module 418 adjusts the statistical value to be within the pre-determined range.

In some embodiments, the bias compensation module 418 provides the adjusted statistical value via the high-speed port 415, the high-speed bus 412, the high-speed port 410, the MSPI 406, and a communication channel to a controller of an RF generator. In various embodiments, the bias compensation module 418 provides the adjusted statistical value via the VME communication block 422 to a port, e.g., an Ethernet port, an EtherCAT port, a USB port, a parallel port, a serial port, etc., of an RF generator, or to a port of the remote computer system.

The microprocessor 404 includes an event/fault detection module 420 that detects an event, e.g., a fault, etc., at a point within the plasma system 151 (FIG. 2), e.g., at a point within the plasma chamber 111, or at a point within the impedance matching circuit 106, or at a point on the RF transmission line 132 (FIG. 2), or at a point within the x MHz RF generator, or at a point within the y MHz RF generator, or at a point within the z MHz RF generator, or at a point on an RF cable that couples an RF generator to the impedance matching circuit 106, etc. For example, upon determining that a statistical value received from the SD logic bock 416 is outside a pre-determined range, the event/fault detection module 420 determines that an event has occurred within the plasma system 151 (FIG. 2). An indication of an occurrence of the event is sent from the event/fault detection module 420 via the VME communication block 422 to one or more devices, e.g., the x MHz RF generator, the y MHz RF generator, the z MHz RF generator, the remote computer system, etc. The event/fault detection module 420 is an example of the event/fault detection module 198 (FIG. 2).

Figure 4:
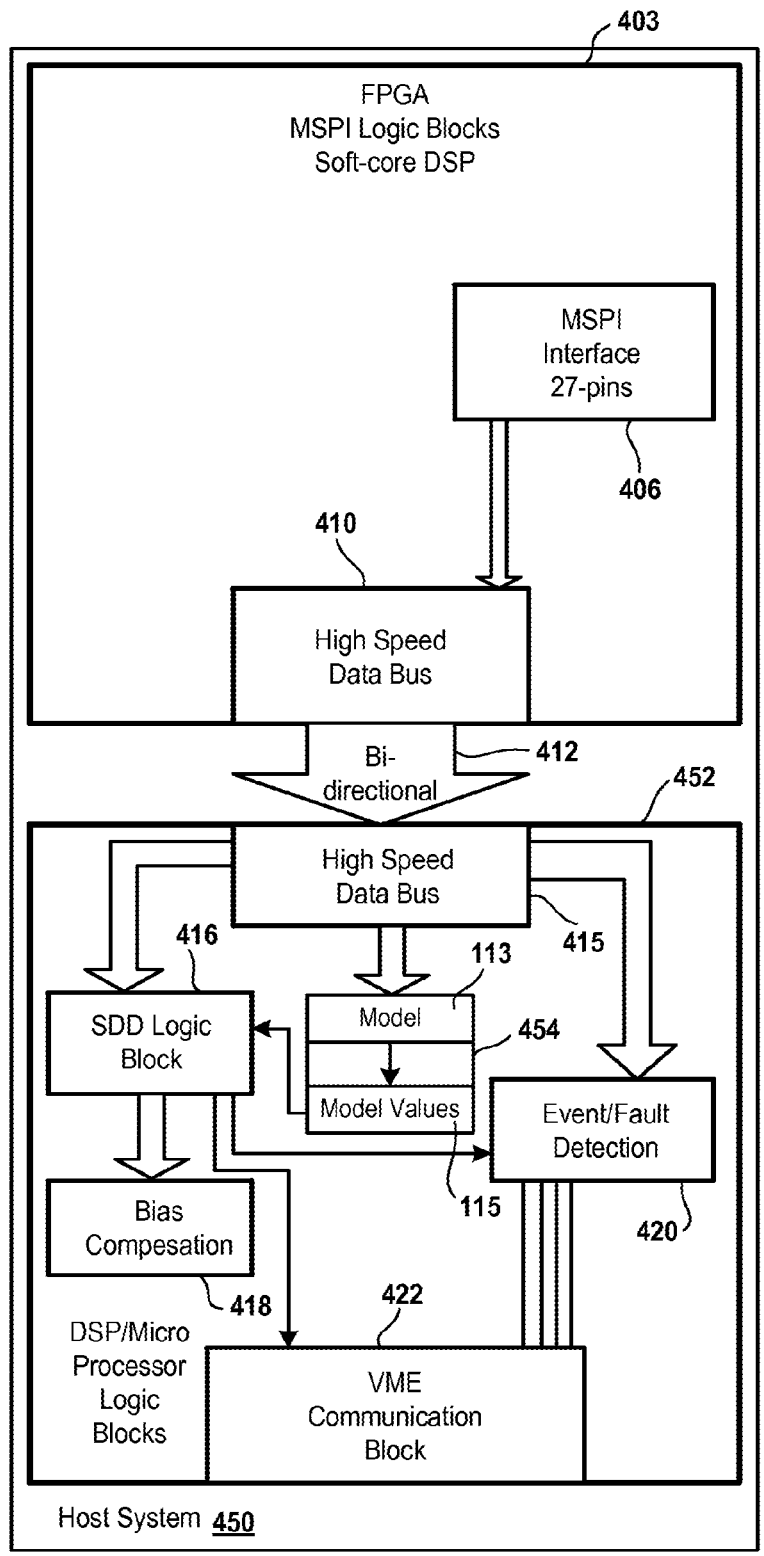
FIG. 4 is a diagram of another host system of the plasma system of FIG. 1 or FIG. 2, in accordance with an embodiment described in the present disclosure.

FIG. 4 is a block diagram of an embodiment of a host system 450, which is another example of the host system 190 (FIG. 2). The host system 450 is similar to the host system 400 (FIG. 4) except that the host system 450 includes a microprocessor 452 and an FPGA 403. The microprocessor 452 is similar to the microprocessor 404 (FIG. 3) except that the microprocessor 452 includes a variable module 454. Moreover, the FPGA 403 is similar to the FPGA 402 except that the FPGA 403 excludes the soft-core DSP 408 (FIG. 3).

The model value generator 115 of the variable module 454 receives data of one or more variables from the MSPI 406 via the high-speed port 410, the high-speed bus 412, and the high-speed port 415. The model value generator 115 of the variable module 454 determines data of variables at an output of the model 113 based on data of variables received from the MSPI 406 and characteristics, e.g., capacitance, impedance, etc., of the model 113. For example, when plasma impedance received via the MSPI 406 is Z1 and an impedance of elements of the RF transmission model is Z2, the model value generator 115 determines an impedance at an output of the RF transmission model to be a directional sum of Z1 and Z2. As another example, when a complex voltage and current received via three communication channels is complex V&I1 and a complex voltage and current of the RF transmission model is complex V&I2, the model value generator 115 determines a complex V&I at an output of the RF transmission model to be a directional sum of V&I1 and V&I2.

The SDD logic block 416 receives data of variables generated by the variable module 454 and determines a statistical value from the data in a manner similar to that explained above. Moreover, the bias compensation module 418 receives a statistical value from the SDD logic block 416 and determines a bias to apply to the plasma chamber 111 (FIG. 1) based on the statistical value. For example, upon determining that a statistical value is outside a pre-determined range, the bias compensation module 418 adjusts the statistical value to be within the pre-determined range.

The bias compensation module 418 sends the adjusted statistical value in a similar manner as that described above to one or more PSPIs of one or more of the x, y, and z controllers (FIG. 2). For example, the bias compensation module 418 determines an adjusted statistical value of power and an adjusted statistical value of frequency and provides the adjusted statistical values via the high-speed port 415, the high-speed bus 412, the high-speed port 410, the MSPI 406, and communication channels to the x controller. In some embodiments, the bias compensation module 418 sends the adjusted statistical value via the VME communication block 422 to a port, e.g., an Ethernet port, an EtherCAT port, a USB port, a parallel port, a serial port, etc., of an RF generator or to a port of the remote computer system.

The event/fault detection module 420 detects an event within the plasma system 151 (FIG. 2) based on a statistical value received from the SDD logic block 416. For example, upon determining that the statistical value is outside a pre-determined extent, the event/fault detection module 420 determines that an event has occurred within the plasma system 151. The statistical value is generated from data of variables that is generated by the variable module 454.

An indication of the occurrence of the event is sent from the event/fault detection module 420 via the VME communication block 422 to one or more devices, e.g., the remote computer system, the x MHz RF generator, the y MHz RF generator, the z MHz RF generator, etc. The user views the indication on the display device of the remote computer system and may decide to take action to resolve the fault.

Figure 5:
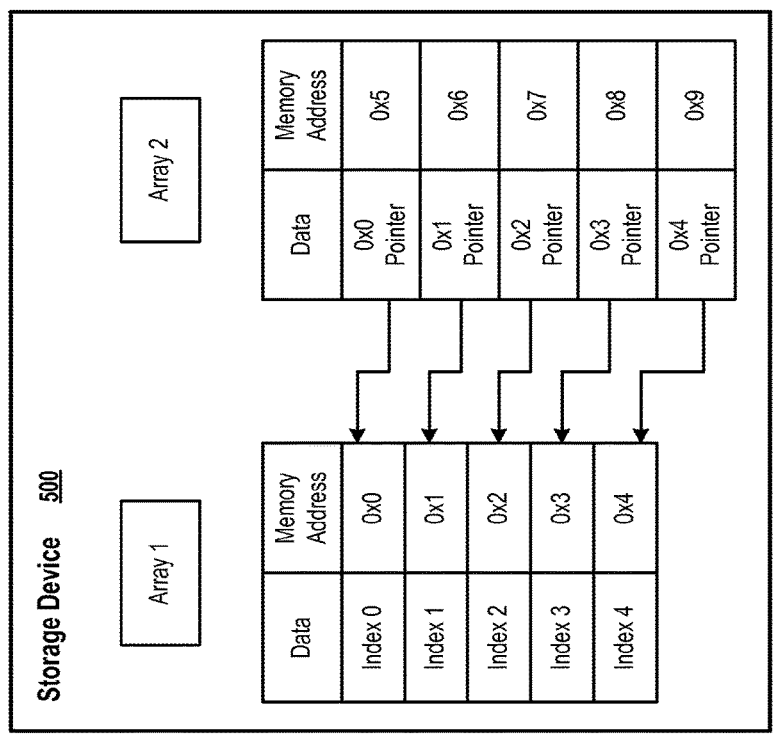
FIG. 5 is a diagram of a storage device for illustrating use of pointers to access a memory location, in accordance with an embodiment described in the present disclosure.

FIG. 5 is a diagram of an embodiment of a storage device 500 for illustrating use of pointers to access a memory location. The storage device 500 is within the variable receiver 110 (FIGS. 1 & 2). In some embodiments, the storage device 500 is within the data amount calculator 112, or the limit crossover determination module 114, or the SD module 116.

The storage device 500 includes a memory array 1 and a memory array 2. The memory array 1 stores data of a variable and the memory array 2 stores memory addresses of locations within the memory array 1. Examples of data of a variable is shown as index 0, index 1, index 2, index 3, and index 4.

As shown, data of a variable is received within the memory array 1 and stored in memory addresses 0x0, 0x1, 0x2, 0x3, and 0x4. When data of a variable is received within the memory array 1, pointer to the data is generated within the memory array 2 by a processor, e.g., a processor of the data amount calculator 112, or a processor of the limit crossover determination module 114, or a processor of the SD module 116, etc. A 0x0 pointer is stored in a memory address 0x5 and points to the value index 0. A 0x1 pointer is stored in a memory address 0x6 and points to the value index 1. Moreover, a 0x2 pointer is stored in a memory address 0x7 and points to the value index 2, a 0x3 pointer is stored in a memory address 0x8 and points to the value index 3, and a 0x4 pointer is stored in a memory address 0x9 and points to the value index 4.

Although five values are shown in FIG. 5, in some embodiments, more or less than five values are stored in the memory array 1.

It should be noted that in some embodiments, pointers are used to point to a memory address to access, modify, or delete data of a variable at the memory address. In various embodiments, a pointer is used to change a location of a value within a storage device. Each location in a storage device, e.g., a memory array, a group of memory arrays, etc., is identified by a memory address.

Figure 6:
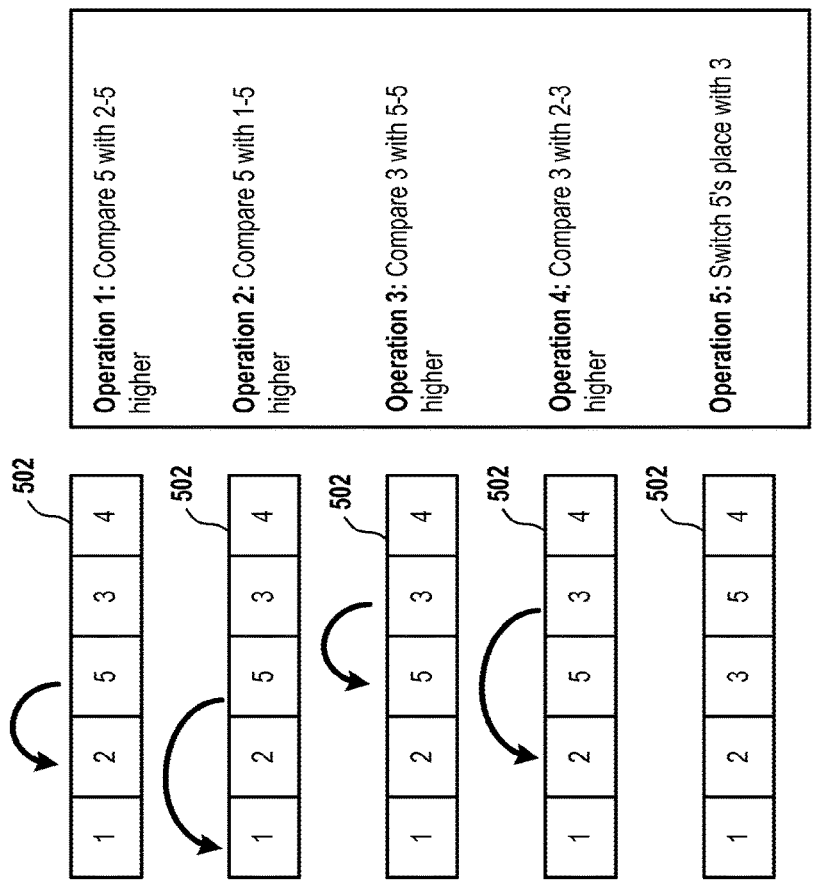
FIG. 6 is a diagram of an insertion sort operation, in accordance with an embodiment described in the present disclosure.

FIG. 6 is a diagram of an embodiment of an insertion sort operation. Data of a variable is stored within a memory array 502, which is an example of the memory array 1 (FIG. 5). For example, 1, 2, 5, 3, and 4 are values of a variable stored within the memory array 502. In the insertion sort operation, a comparison is performed between each value of the memory array 502 and remaining values of the memory array 502 to sort values of the memory array 502 from a lowest of all the values to a highest of all the values. For example, 5 is compared with 2. It is determined that 5 is greater than 2 and so a pointer that points to a third location from the left in the memory array 502 still points to the third location. As another example, 5 is compared with 1. It is determined that 5 is greater than 1 and so a pointer that points to a third location from the left in the memory array 502 still points to the third location. As yet another example, 3 is compared with 5 and it is determined that 3 is lower than 5. Moreover, a pointer that points to a third location from the left in the memory array 502 is changed to point to a fourth location from the left in the memory array 502 and a pointer that points to the fourth location is now changed to point to the third location. In this example, 3 is made to switch places with 5 in the memory array 502.

The sorting is performed to sort the values in the memory array 502 from the lowest of the values to the highest of the values to determine a minimum value and a maximum value from the values.

Although five values are shown in FIG. 6, in some embodiments, more or less than five values are stored in the memory array 502.

Figure 7:
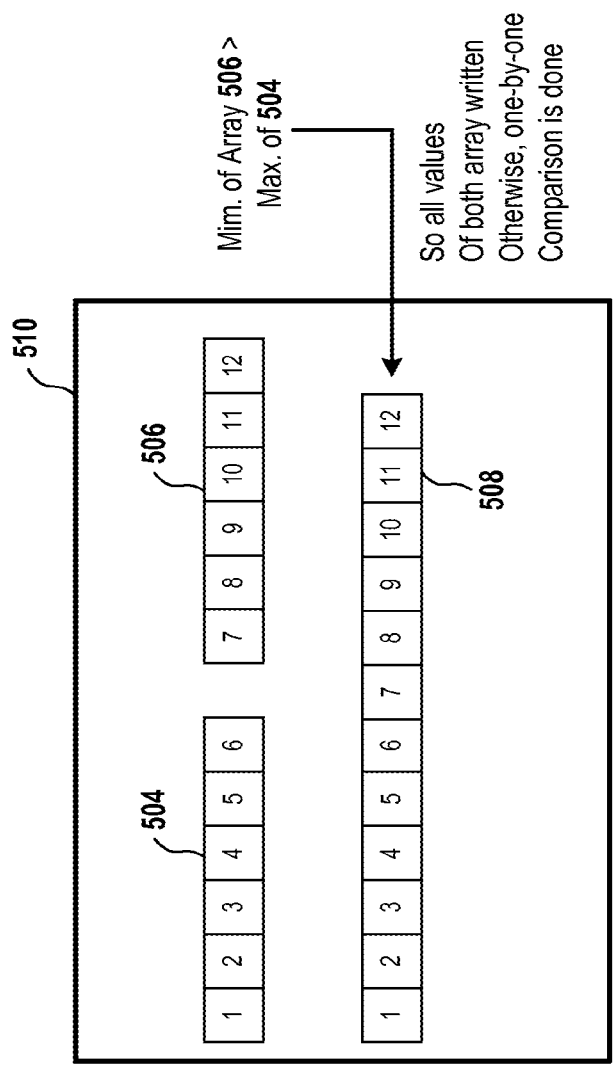
FIG. 7 is a diagram of memory arrays to illustrate a merge sort operation, in accordance with an embodiment described in the present disclosure.

FIG. 7 is a diagram of an embodiment of three memory arrays 504, 506, and 508 to illustrate a merge sort operation. The memory arrays 504, 506, and 508 are parts of a storage device 510. The storage device 510 is within the variable receiver 110 (FIGS. 1 & 2). In some embodiments, the storage device 510 is within the data amount calculator 112, or the limit crossover determination module 114, or the SD module 116. In various embodiments, the memory arrays 504 and 506 are within a storage device of the variable receiver 110 and the merged memory array 508 is within a storage device of the SD module 116.

The values of a variable within the memory arrays 504 and 506 are generated after performing an insertion sort operation. For example, values of a variable within the memory array 504 is sorted from a lowest of all values within the memory array 504 to a highest of all values in the memory array 504. As another example, values of a variable within the memory array 506 is sorted from a lowest of all values within the memory array 506 to a highest of all values in the memory array 506.

Data of a variable is received within the memory arrays 504 and 506. During a merge sort operation, a maximum of all values of the memory array 504 is determined and a minimum of all values of the memory array 506 is determined. It is further determined whether the minimum value in the memory array 506 is greater than the maximum value of the memory array 504.

Upon determining that the minimum value in the memory array 506 is not greater than the maximum value in the memory array 504, each value of the memory array 504 is compared with each value in the memory array 506. On the other hand, upon determining that the minimum value in the memory array 506 is greater than the maximum value in the memory array 504, a comparison is not performed between values of the memory arrays 504 and 506. In the case the comparison is not performed, the merged memory array 508 that includes all values of the memory arrays 504 and 506 is generated. For example, values of the memory arrays 504 and 506 are written into the merged memory array 508 in an order of the values within the memory arrays 504 and 506.

In various embodiments, a memory address of the memory array 506 in which a value "7" is stored is immediately after, e.g., right next to, is consecutive to, etc., a memory address of the memory array 504 in which a value "6" is stored. In some embodiments, a memory address of the memory array 506 in which the value "7" is stored is after, e.g., not right next to, within two memory addresses of, within a number of memory addresses of, etc., but not immediately after a memory address of the memory array 504 in which the value "6" is stored.

In various embodiments, the memory arrays 504 and 506 are separated by a number, e.g., one, two, etc., of empty memory addresses.

It should be noted that although each memory array 504 and 506 includes six values, in some embodiments, each memory array 504 and 506 includes a different number of values of a variable.

In various embodiments, the merged memory array 508 has the same size, e.g., number of memory addresses, etc., as that of a total number of memory addresses in the memory arrays 504 and 506.

Figure 8:
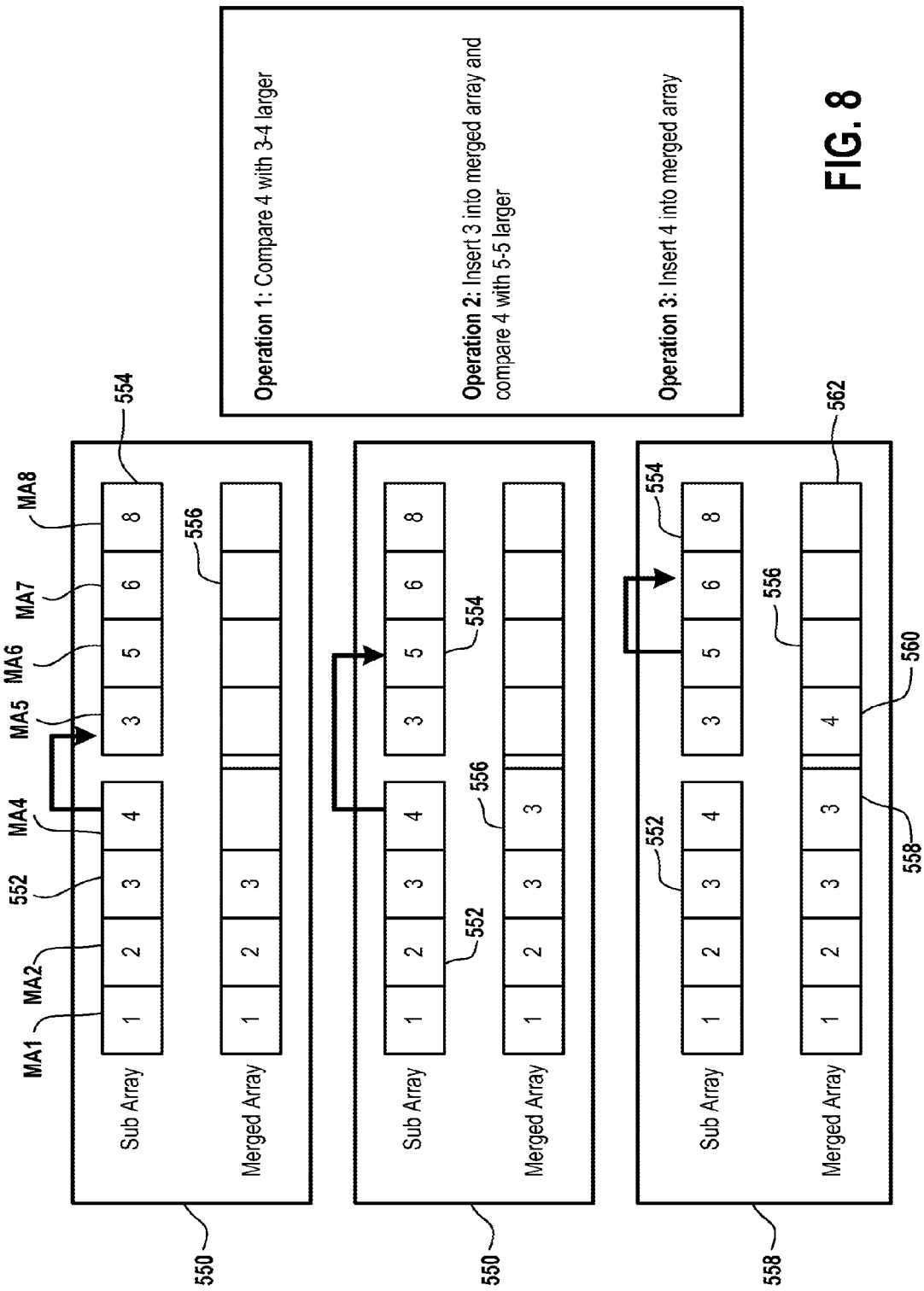
FIG. 8 is a diagram of a storage device to illustrate a comparison operation within a merge sort operation, in accordance with an embodiment described in the present disclosure.

FIG. 8 is a diagram of an embodiment of a storage device 550 to illustrate a comparison operation within a merge sort operation. The storage device 550 includes memory arrays 552 and 554, and a merged memory array 556. The memory arrays 552, 554, and 556 are parts of the storage device 550, which is located within the variable receiver 110 (FIGS. 1 & 2). In some embodiments, the storage device 550 is within the data amount calculator 112, or the limit crossover determination module 114, or the SD module 116. In various embodiments, the memory arrays 552 and 554 are within a storage device of the variable receiver 110 and the merged memory array 556 is within a storage device of the SD module 116.

While performing a one-by-one comparison between values of the memory arrays 552 and 554, it is determined whether a value within a memory address of the memory array 552 is less than a value within a memory address of the memory array 554. For example, it is determined whether a value "4" of the memory array 552 is less than a value "3" of the memory array 554. As another example, each value of a variable within the memory array 552 is compared with each value of a variable within the memory array 554 in an order of memory addresses within the memory array 552 and 554. To further illustrate the order of comparison, a value "1" within a memory address MA1 of the memory array 552 is compared with values "3", "5", "6", and "8" in memory addresses MA5, MA6, MA7, and MA8 of the memory array 554. Then, a value "2" in a memory address MA2 of the memory array 552 is compared with values "3", "5", "6", and "8" in memory addresses MA5, MA6, MA7, and MA8 of the memory array 554. The memory address MA1 is lower than the memory address MA2.

Upon determining that a value within a memory address of one of the memory arrays 552 and 554 is less than a value within a memory address of the remaining of the memory arrays 552 and 554, it is determined to insert, e.g., write, etc., the lesser value into an empty memory address within the merged memory array 556. For example, upon determining that the value "3" within the memory array 554 is less than the value "4" within the memory array 552, the value "3" is written into a memory address 558 of the merged memory array 556. As another example, upon determining that the value "4" within the memory array 552 is less than the value "5" within the memory array 554, the value "4" is written into a memory address 560 of the merged memory array 556. The empty memory address within the merged memory array 556 is consecutive to an occupied memory address of the merged memory array 556.

During a merge sort operation, after a comparison is performed between values of the memory arrays 552 and 554, any value of the memory array 554 that is not written into the merged array 556 is compared with remaining unwritten values of the memory array 554. For example, the value "5" of the memory array 554 is compared with a value "6" of the memory array 554. The comparison is performed in an order of memory addresses of the memory array 554 that include values that are yet not written into the merged memory array 556. For example, in case in which values "5", "6", and "8" are not written in the merged memory array 556, the value "5" within a lowest memory address from memory addresses in which the values "5", "6", and "8" are stored in the memory array 554 is compared with the values "6" and "8". The memory address of the value "6" is lower than the memory address of the value "8" in the memory array 554.

During a merge sort operation, while comparing the unwritten values, a lesser of the unwritten values is written into the merged memory array 556. For example, when a comparison is performed between the values "5" and "6" in the memory array 554, the value "5" is written into the merged memory array 556. As another example, when a comparison is performed between the values "6" and "8" in the memory array 554, the value "6" is written into the memory array 556. Any remaining value after the comparison of the unwritten values is written into an empty address of the merged memory array 556 that is consecutive to a memory address that is written with a value. For example, the value "8" of the memory array 554 is written into a memory address 562 of the memory array 556.

At an end of a merge sort operation, the merged memory array 556 is sorted from a lowest of all values within the memory arrays 552 and 554 to a highest of all values of the memory arrays 552 and 554.

It should be noted that although each memory array 552 and 554 includes four values, in some embodiments, each memory array 552 and 554 includes a different number of values of a variable.

In various embodiments, the memory arrays 552 and 554 are separated by a number, e.g., one, two, etc., of empty memory addresses. In some embodiments, the memory address MA5 is consecutive to a memory address MA4 of the memory array 552.

In various embodiments, the merged memory array 556 has the same size as that of a total number of memory addresses in the memory arrays 552 and 554.

Figure 9:
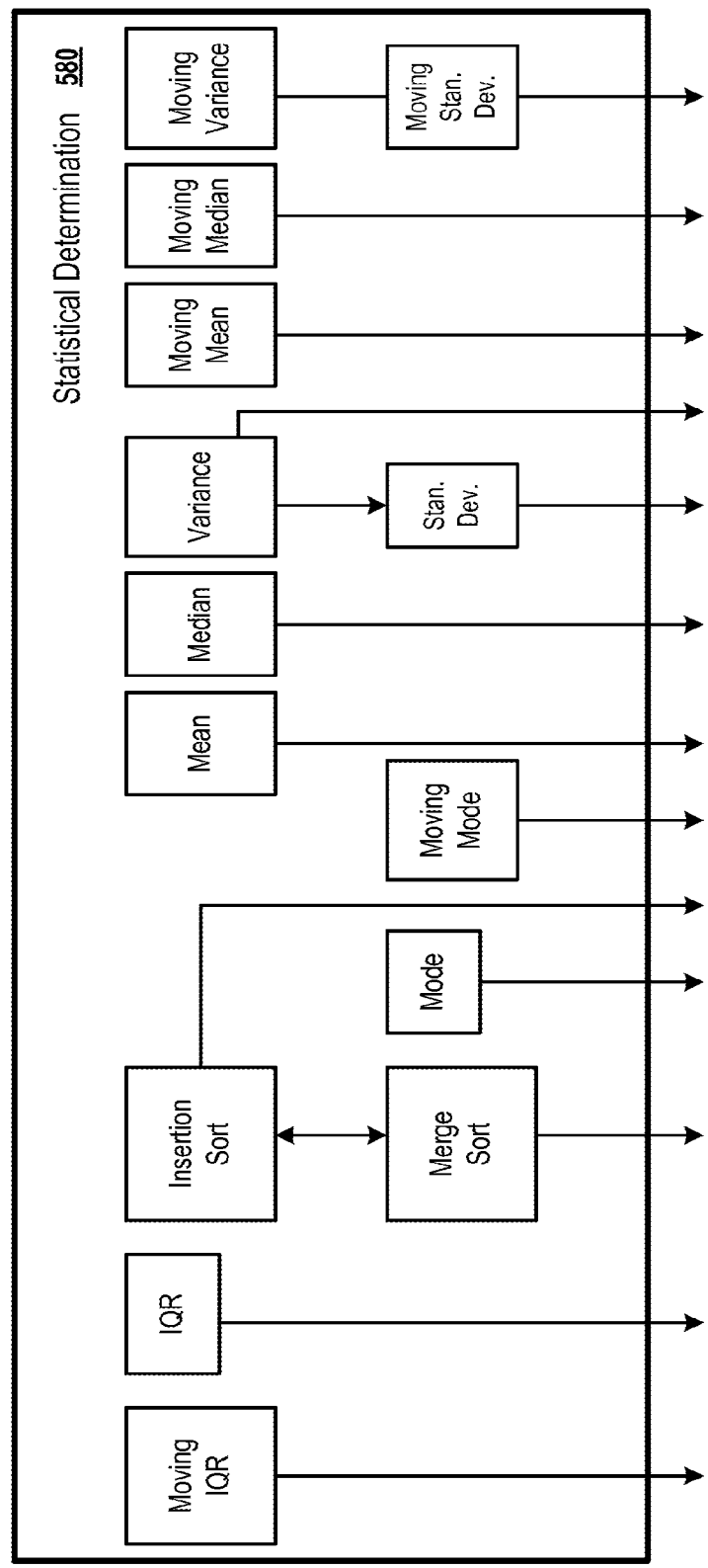
FIG. 9 is a diagram of a statistical determination (SD) module of the plasma system of FIG. 1 or FIG. 2, in accordance with an embodiment described in the present disclosure.

FIG. 9 is a diagram of an embodiment of an SD module 580, which is an example of the SD module 116 (FIGS. 1 and 2). The SD module 580 includes a moving IQR module, an IQR module, an insertion sort module, a merge sort module, a mode module, a moving mode module, a mean module, a median module, a variance module, a standard deviation module, a moving mean module, a moving median module, a moving variance module, and a moving standard deviation module.

The moving IQR module determines a moving IQR of values of a variable within a memory array, e.g., the memory array 502 (FIG. 6), or the memory array 504 (FIG. 7), or the memory array 506 (FIG. 7), or the merged memory array 508 (FIG. 7), or the memory array 552 (FIG. 8), or the memory array 554 (FIG. 8), or the merged memory array 556 (FIG. 8), etc. Similarly, the IQR module calculates an IQR of values of a variable within a memory array. Moreover, the insertion sort module applies an insertion sort operation to values of a variable within a memory array. The merge sort module applies a merge sort operation to values of a variable within a memory array. The mode module determines a mode of values of a variable within a memory array. Similarly, the moving mode module determines a moving mode of values of a variable within a memory array. The mean module calculates an average of values of a variable within a memory array. The median module generates a median of values of a variable within a memory array.

The variance module calculates a variance of values within a memory array and the standard deviation module determines a standard deviation of values within a memory array. The moving mean module calculates a moving average of values of a variable within a memory array and the moving median module determines a moving median of values of a variable within a memory array. The moving variance module calculates a moving variance of values within a memory array and the moving variance module determines a moving variance of values within a memory array. The moving standard deviation generates a moving standard deviation of values within a memory array.

A moving statistical value, e.g., a moving IQR value, or a moving mode value, or a moving mean value, or a moving median value, or a moving variance value, or a moving standard deviation value, etc., is a value that dynamically considers values of a variable as the values are being received by a memory array, e.g., a buffer of the SD module 116 (FIGS. 1 & 2), from the model value generator 115 (FIGS. 1 & 2), etc. For example, a moving average of values "1", "2", and "5" in the memory array 502 (FIG. 6) at a time the values "3" and "4" of the memory array 502 are not received is different than a moving average of values "1", "2", "5", "3" and "4". As another example, a moving standard deviation of values "1", "2", and "3" in the merged memory array 556 (FIG. 8) at a time the remaining values "3" and "4" of the merged memory array 556 are not generated within the merged memory array 556 is different than a moving average of the values "1", "2", "3", "3" and "4" of the merged memory array 556.

In various embodiments, a rate of receipt of values within a buffer of the SD module 116 from the model value generator 115 is the same as the rate of receipt of values by the variable receiver 110 (FIGS. 1 & 2).

In some embodiments, the SD module 580 includes the moving IQR module, or the IQR module, or the insertion sort module, or the merge sort module, or the mode module, or the moving mode module, or the mean module, or the median module, or the variance module, or the standard deviation module, or the moving mean module, or the moving median module, or the moving variance module, or the moving standard deviation module, or a combination thereof. For example, the SD module 580 includes the moving IQR module and the insertion sort module. As another example, the SD module 580 includes the merge sort module and the moving mean module and the moving standard deviation module.

In various embodiments, each of the moving IQR module, and the IQR module, and the insertion sort module, and the merge sort module, and the mode module, and the moving mode module, and the mean module, and the median module, and the variance module, and the standard deviation module, and the moving mean module, and the moving median module, and the moving variance module, and the moving standard deviation module are implemented as separate processors. For example, the moving IQR module is implemented as one processor and the mode module is implemented as another processor.

In a number of embodiments, one or more of the moving IQR module, the IQR module, the insertion sort module, the merge sort module, the mode module, the moving mode module, the mean module, the median module, the variance module, the standard deviation module, the moving mean module, the moving median module, the moving variance module, and the moving standard deviation module are implemented as one processor and any remaining of the moving IQR module, the IQR module, the insertion sort module, the merge sort module, the mode module, the moving mode module, the mean module, the median module, the variance module, the standard deviation module, the moving mean module, the moving median module, the moving variance module, and the moving standard deviation module are implemented as another processor.

In a number of embodiments, each of the moving IQR module, the IQR module, the insertion sort module, the merge sort module, the mode module, the moving mode module, the mean module, the median module, the variance module, the standard deviation module, the moving mean module, the moving median module, the moving variance module, and the moving standard deviation module is implemented as a computer program stored in a non-transitory computer-readable medium, or as hardware, or a combination of the hardware and the computer program.

In some embodiments, a mean is calculated in parallel with performing an insertion sort operation. For example, values of a variable are summed in parallel with sorting the values from a minimum of the values to a maximum of the values.

In several embodiments, an IQR or a median is determined after performing an insertion sort operation. After the insertion sort operation is performed, values of a variable are sorted from a lowest of the values to a highest of the values. When the number of values is odd, a value located in middle of the sorted values is a median. When the number of values is even, an average of two values located in middle of the sorted values is a median. The median calculated is used to determine IQR.

In various embodiments, a mean is calculated in parallel with performing a merge sort operation. The mean is calculated from all values that are sorted after the merge sort operation.

In several embodiments, an IQR or a median is determined after performing a merge sort operation. After the merge sort operation is performed, values of a variable are sorted from a lowest of the values to a highest of the values. When the number of values is odd, a value located in middle of the sorted values is a median. When the number of values is even, an average of two values located in middle of the sorted values is a median. The median calculated is used to determine IQR.

Figure 10:
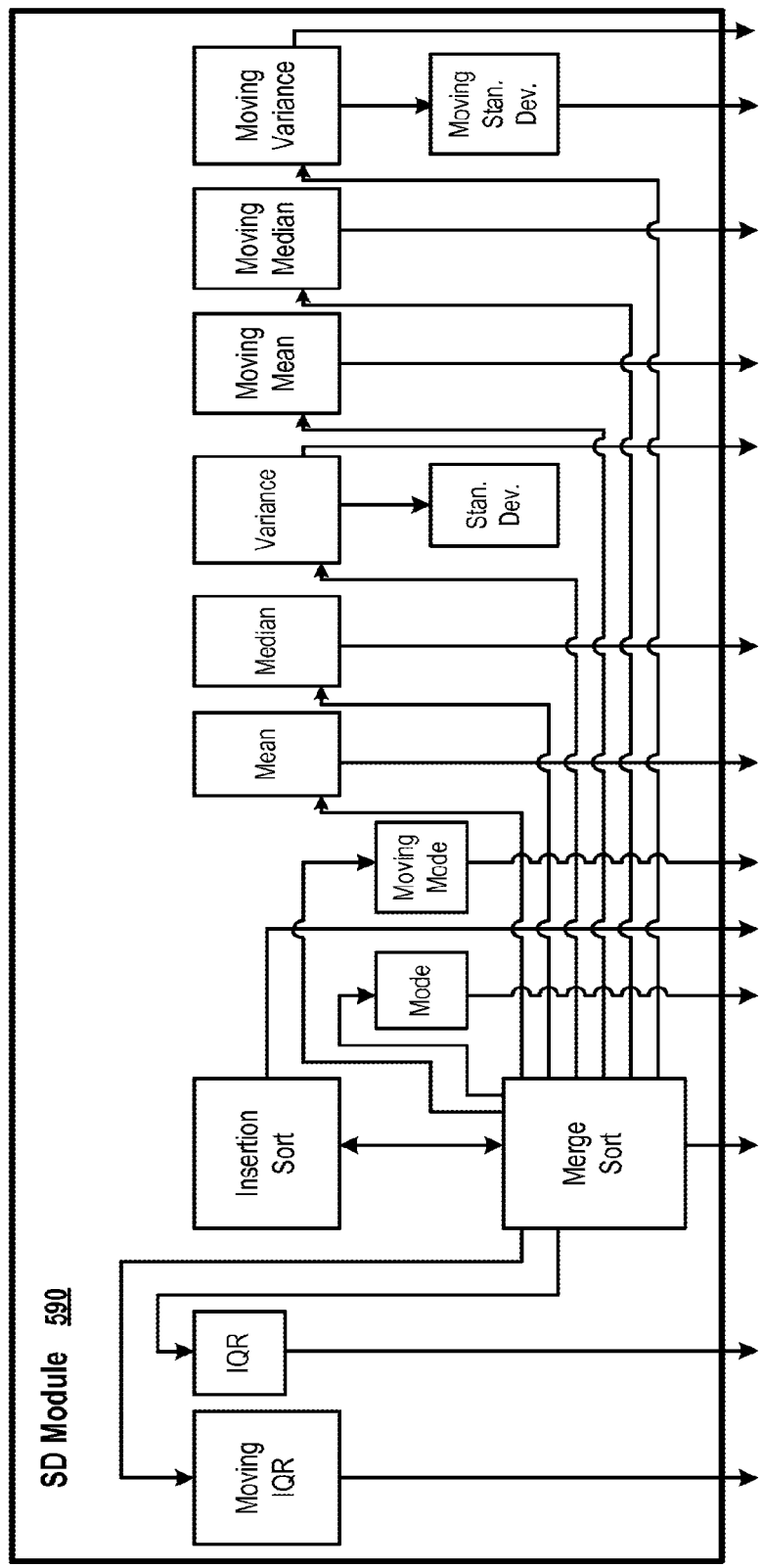
FIG. 10 is a diagram of an SD module of the plasma system of FIG. 1 or FIG. 2, in accordance with an embodiment described in the present disclosure.

FIG. 10 is a diagram of an embodiment of an SD module 590, which is an example of the SD module 116 (FIGS. 1 and 2). The SD module 590 includes the moving IQR module, the IQR module, the insertion sort module, the merge sort module, the mode module, the moving mode module, the mean module, the median module, the variance module, the standard deviation module, the moving mean module, the moving median module, the moving variance module, and the moving standard deviation module.

Moreover, in the SD module 590, the merge sort module is connected to the moving IQR module, to the IQR module, to the insertion sort module, to the mode module, to the moving mode module, to the mean module, to the median module, to the variance module, to the standard deviation module, to the moving mean module, to the moving median module, to the moving variance module, and to the moving standard deviation module.

The moving IQR module calculates a moving IQR of values within a merged memory array, e.g., the merged memory array 508 (FIG. 7) or the merged memory array 556 (FIG. 8), etc. Similarly, the IQR module calculates an IQR of values within a merged memory array. Moreover, mean module calculates a mean of values within a merged memory array. The median module generates a median of values within a merged memory array. The mode module generates a mode of values within a merged memory array and the moving mode module calculates a moving mode of values within a merged memory array. Moreover, the variance module calculates a variance of values within a merged memory array. The standard deviation module determines a standard deviation of values within a merged memory array and the moving mean module calculates a moving mean of values within a merged memory array. The moving median module determines a moving median of values within a merged memory array and the moving variance module calculates a moving variance of values within a merged memory array. The moving standard deviation module generates a moving standard deviation of values within a merged memory array.

In some embodiments, the SD module 590 includes the moving IQR module, or the IQR module, or the insertion sort module, or the merge sort module, or the mode module, or the moving mode module, or the mean module, or the median module, or the variance module, or the standard deviation module, or the moving mean module, or the moving median module, or the moving variance module, or the moving standard deviation module, or a combination thereof.

Figure 11:
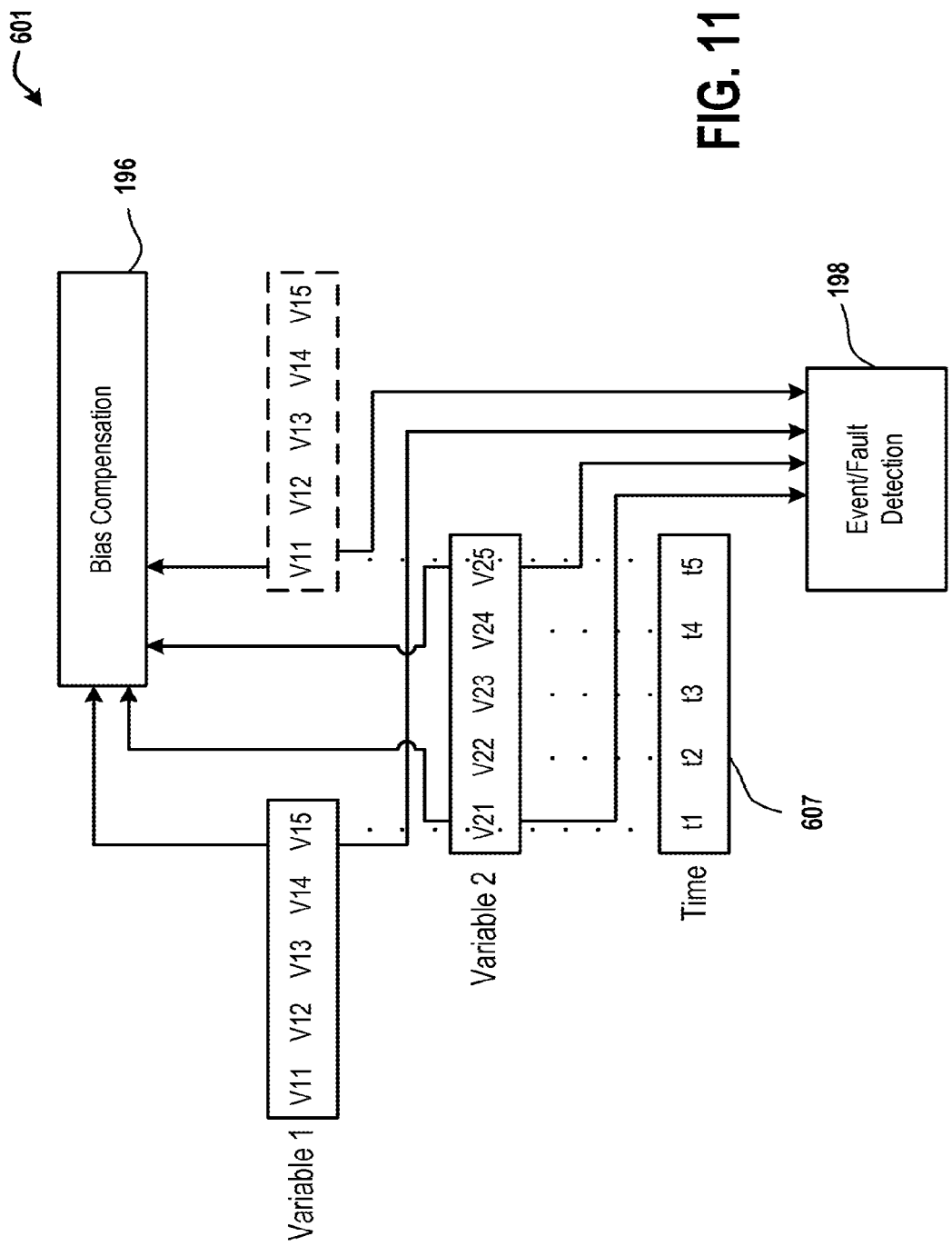
FIG. 11 is a diagram of an embodiment of a time slice sampling method to compensate for bias and/or to detect a fault in a plasma system, in accordance with one embodiment described in the present disclosure.

FIG. 11 is a diagram of an embodiment of a system 601 for applying a time slice sampling method. The system 601 includes the bias compensation module 196 and the event detection module 198. The bias compensation module 196 and/or the event detection module 198 receives a time of generation of a value of a variable from the SD module 116 (FIGS. 1 & 2). For example, a time t1 is a time of generation of a variable value V21 by the SD module 116. As another example, a time t2 is a time of generation of a variable value V22 by the SD module 116, a time t3 is a time of generation of a variable value V23 by the SD module 116, and a time t4 is a time of generation of a variable value V24 by the SD module 116. As yet another example, a time t5 is a time of generation of a variable value V25 by the SD module 116 and of generation of a variable value V11 by the SD module 116. The times t1 thru t5 are calculated by the SD module 116. In some embodiments, the time t1 is a time of generation of the variable value V15 and of the variable V21.

In some embodiments, Variable values V11, V12, V13, V14, and V15 are values of a first variable, which is variable 1. Variable values V21, V22, V23, V24, and V25 are values of a second variable, which is variable 2. The variable 1 is different from the variable 2. For example, the variable 1 is power and the variable 2 is voltage. As another example, the variable 1 is current and the variable 2 is voltage.

In various embodiments, the variable 1 and the variable 2 are the same variable and generated based on values from different RF generators. For example, the variable 1 is generated from voltage values of the x MHz RF generator and the variable 2 is generated from voltage values of the y MHz RF generator. As another example, the variable 1 is generated from frequency values of the y MHz RF generator and the variable 2 is generated from frequency values of the z MHz RF generator.

The variables V11 thru V15 are stored in a memory array, e.g., an insertion sorted array, a merged array, etc., of the SD module 116 (FIGS. 1 & 2). For example, the variable values V11 thru V15 are sorted from a lowest of the values to a highest of the values. In this example, V11 is the lowest value and V15 is the highest value. Moreover, the variables V21 thru V25 are stored in a memory array, e.g., an insertion sorted array, a merged array, etc., of the SD module 116 (FIGS. 1 & 2). For example, the variable values V21 thru V25 are sorted from a lowest of the values to a highest of the values. In this example, V21 is the lowest value and V25 is the highest value. Also, the times t1 thru t5 are stored in a memory array 607 of the bias compensation module 196 and/or of the event detection module 198. The times t1 thru t5 are received by the bias compensation module 196 and/or the event detection module 198 from the SD module 116 for storage in the memory array 607.

The bias compensation module 196 determines whether the time t1 of generation of the variable value V21 is the same as that of the time of generation of the variable value V15. Upon determining that the time t1 of generation of the variable value V21 is the same as that of the variable value V15, the variable values V21 and V15 are used to determine whether a bias exists in a plasma system. For example, upon determining that the variable value V21 is outside a pre-determined range and the variable value V15 is outside a pre-determined range, it is determined that a bias exists. In this example, both the values V15 and V21 are adjusted by the bias compensation module 196 for bias to generate adjusted statistical values. As another example, upon determining that the variable value V21 is within a pre-determined range and the variable value V15 is within a pre-determined range, it is determined that a bias does not exist within a plasma system. As yet another example, upon determining that the variable value V21 is within a pre-determined range and the variable value V15 is outside a pre-determined range, it is determined that a bias does not exist or that a bias exists within a plasma system.

Similarly, the bias compensation module 196 determines whether the time t5 of generation of the variable value V25 is the same as that of the time of generation of the variable value V11. Upon determining that the time t5 of generation of the variable value V25 is the same as that of the variable value V11, the variable values V25 and V11 are used to determine whether a bias exists in a plasma system.

Moreover, in some embodiments, the event detection module 198 determines whether the time t1 of generation of the variable value V21 is the same as that of the time of generation of the variable value V15. Upon determining that the time t1 of generation of the variable value V21 is the same as that of the variable value V15, the variable values V21 and V15 are used to determine whether a fault exists in a plasma system. For example, upon determining that the variable value V21 is outside a pre-determined extent and the variable value V15 is outside a pre-determined extent, it is determined that a fault exists. As another example, upon determining that the variable value V21 is within a pre-determined extent and the variable value V15 is within a pre-determined extent, it is determined that a fault does not exist within a plasma system. As yet another example, upon determining that the variable value V21 is within a pre-determined extent and the variable value V15 is outside a pre-determined extent, it is determined that a fault does not exist or that a fault exists within a plasma system.

Figure 12:
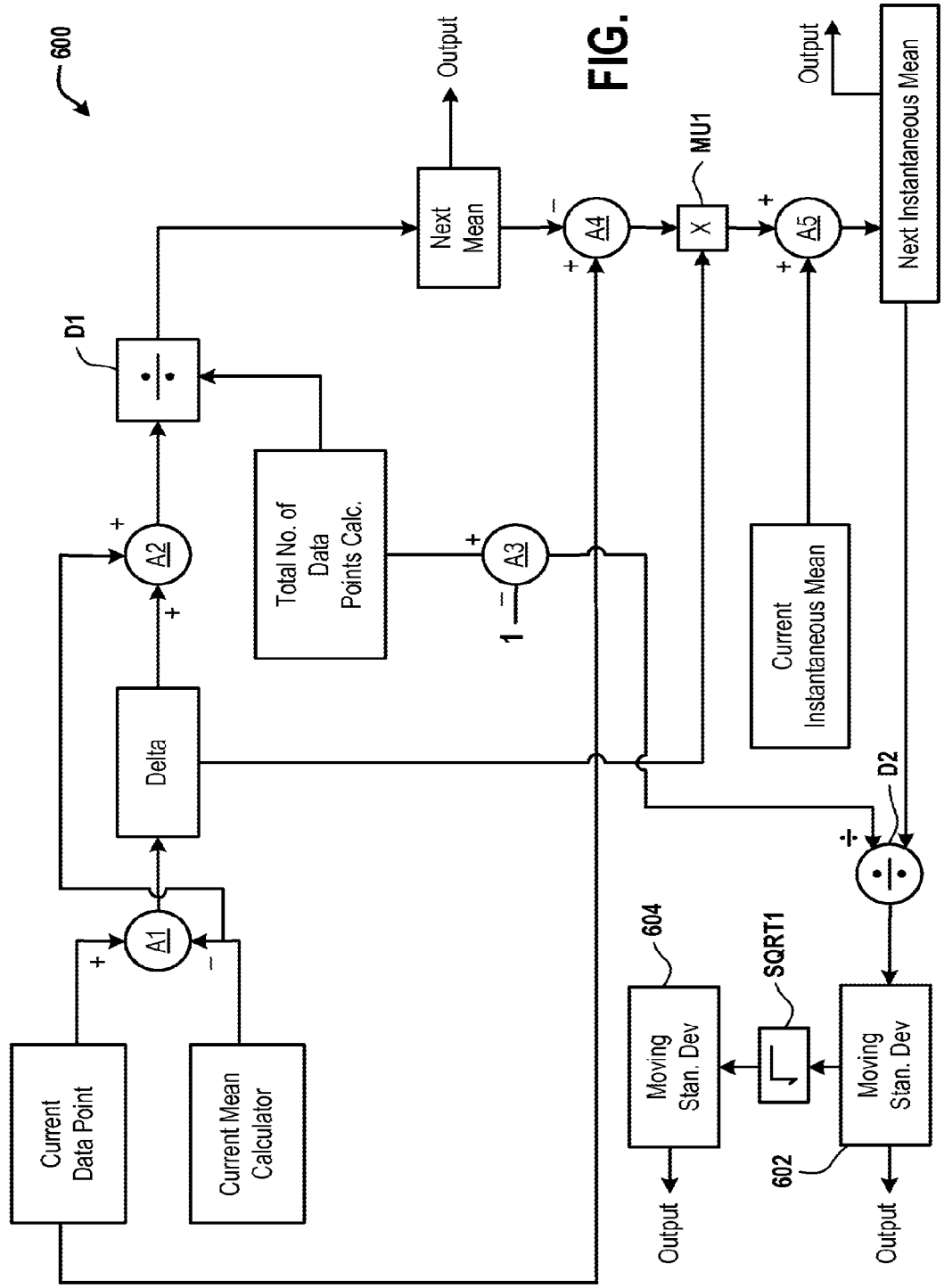
FIG. 12 is a block diagram of an SD module that is used to generate a moving variance, in accordance with an embodiment described in the present disclosure.

Similarly, the event detection module 198 determines whether the time t5 of generation of the variable value V25 is the same as that of the time of generation of the variable value V11. Upon determining that the time t5 of generation of the variable value V25 is the same as that of the variable value V11, the variable values V25 and V11 are used to determine whether a fault exists in a plasma system FIG. 12 is a block diagram of an embodiment of an SD module 600 that is used to generate a moving variance 602. The SD module 600 includes a number of adders A1, A2, A3, A4, and A5, a multiplier MU1, dividers D1 and D2, and a square root calculator SQRT1. The SD module 600 is an example of the SD module 116 (FIGS. 1 & 2).

The SD module 600 includes a current mean calculator, which calculates a current mean of values of a variable within a memory array, e.g., the memory array 502 (FIG. 6), or the memory array 504 (FIG. 7), or the memory array 506 (FIG. 7), or the merged memory array 508 (FIG. 7), or the memory array 552 (FIG. 8), or the memory array 554 (FIG. 8), or the merged memory array 556 (FIG. 8), etc. Also, for a current data point x in a memory array, e.g., a value in a memory array, a value in a merged memory array, etc., from which the current mean is calculated, the current mean is subtracted by the adder A1 from the current data point to generate a delta value of a variance. The adder A2 adds the delta value with the current mean to generate a result and the result is divided by a total number of data points n within a memory array from which the current mean value is generated. A data point calculator calculates the total number of data points. The division of the result by the total number of data points is performed by the divider D1 to generate a next mean value of a variable. In some embodiments, the next mean value is a statistical value.

The next mean value is subtracted by the adder A4 from the current data point x to generate an outcome and the outcome is multiplied by the multiplier MU1 with the delta value to generate a consequence. The consequence is added by the adder A5 to a current instantaneous mean M2 to generate a next instantaneous mean M2. In some embodiments, the next instantaneous mean M2 is a statistical value.

The next instantaneous value M2 is divided by the divider D2 by a number that is one less than the total number of data points in a memory array to generate the moving variance 602. In various embodiments, the moving variance 602 is a statistical value.

A square root of the moving variance 602 is calculated by the square root calculator SQRT1 to generate a moving standard deviation 604. In several embodiments, the moving standard deviation 604 is a statistical value.

It should be noted that for each different value in a memory array, the next mean value, the next instantaneous mean, and the moving variance 602 is different. The moving variance 602 changes with a change in value within a memory array.

A pseudo code for generating the moving variance 602 is provided below:

```
def online_variance(data):
    n = 0
    current mean = 0
    M2 = 0
    for x in data:
        n = n + 1
        delta = x − current mean
        next mean = (current mean + delta)/n
        next instantaneous mean M2 = current instantaneous mean M2 +
        delta*(x − next mean)
        moving variance = next instantaneous mean M2/(n − 1)
        return moving variance.
```

In the pseudo code, the total number of data points n, the current mean, and the current instantaneous mean are initialized to zero.

Figure 13:
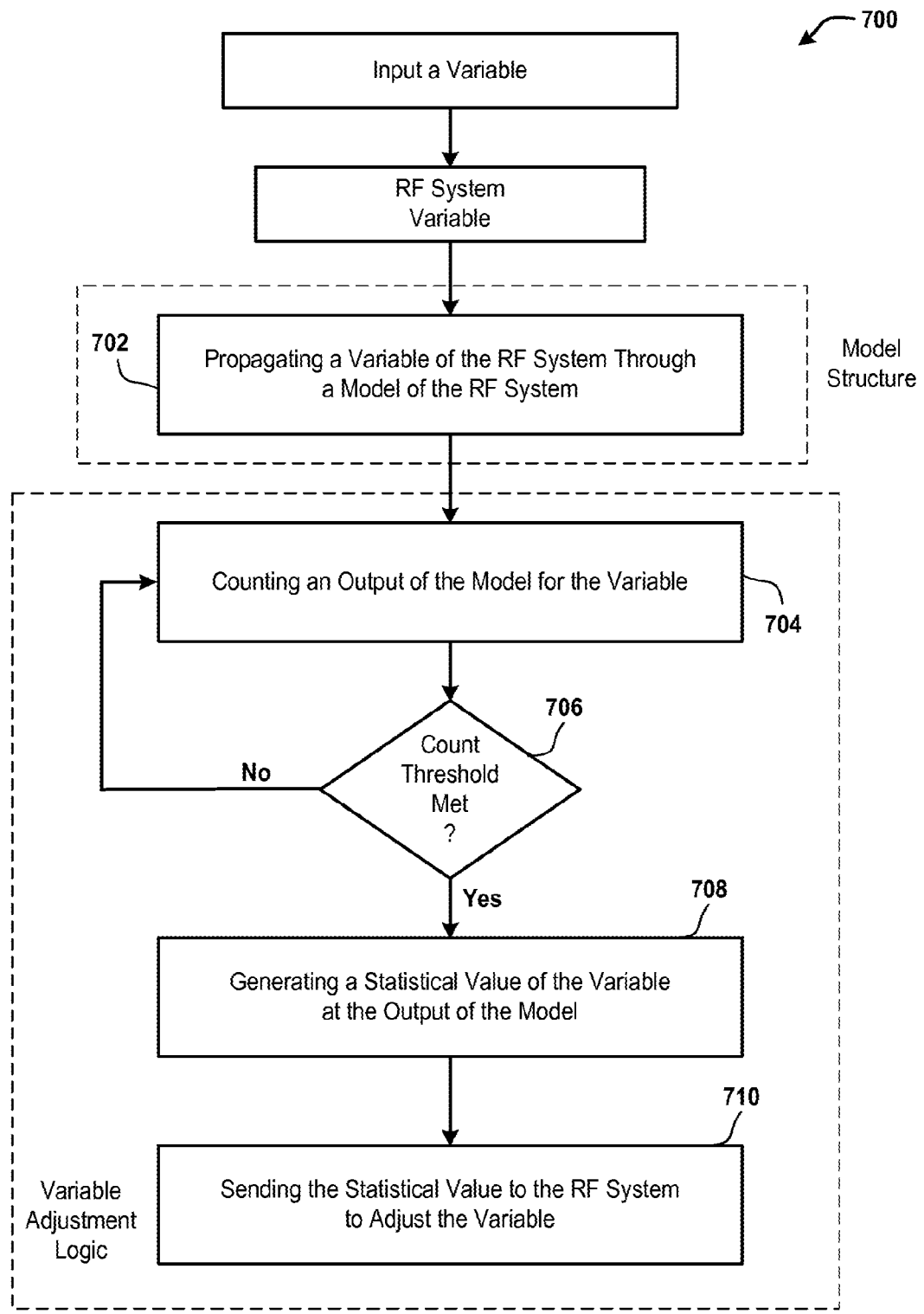
FIG. 13 is a flowchart of a method for generating a statistical value, in accordance with an embodiment described in the present disclosure.

FIG. 13 is a flowchart of an embodiment of a method 700 for generating a statistical value. In the method 700, a variable is input from an RF system e.g., the x controller, or the y controller, or the z controller, or a combination thereof, etc., to a host controller, e.g., the host controller 150 (FIG. 1), or the host controller 192 (FIG. 2), etc. The variable is propagated, in an operation 702, through the model 113 (FIGS. 1-4). For example, a directional sum is calculated. In this example, the directional sum is a sum of a value of the variable and values of components of the model 113 through which the value of the variable is propagated. In some embodiments, the operation 702 is performed by the model value generator 115 (FIGS. 1-4).

The method 700 further includes an operation 704 of counting an output of the model 113 for the variable. For example, a number of values that are generated after propagating the variable through the model 113 is counted. The values are generated at the output of the model 113 and are calculated by the data amount calculator 112 (FIGS. 1 & 2). In some embodiments, the output of the model 113 that is counted includes a directional sum.

In an operation 706 of the method 700, it is determined by the limit crossover determination module 114 whether the count meets a count threshold, which is a pre-stored number of values that is stored in a storage device of the limit crossover determination module 114. The counting of operation 704 continues when the count does not meet, e.g., is less than, etc., the count threshold. On the other hand, when the count meets, e.g., exceeds, is greater than or equal to, etc., the count threshold, in an operation 708, a statistical value is generated from the output of the model 113 that is calculated by the model value generator 115. For example, a statistical value is generated from directional sums of values.

A statistical value is generated by the SD module 116 (FIGS. 1 & 2). The statistical value is sent, in an operation 710, by the sender 174 (FIGS. 1 & 2) to the RF system to adjust the variable. For example, the statistical value is sent to the x, y, and/or z controllers to generate an RF signal based on the statistical value.

It is noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the x MHz, y MHz, and z MHz RF generators are coupled to an inductor within the ICP plasma chamber.

In some embodiments, a kilohertz (kHz) RF generator is used instead of a MHz RF generator. For example, instead of the x MHz RF generator, a 400 kHz RF generator is used.

In various embodiments, a MHz RF generator has a frequency of operation in MHz and a kHz RF generator has a frequency of operation in kHz.

Some embodiments described herein are practiced with various computer system configurations including hand-held devices, microprocessor systems, microprocessor-based or programmable consumer electronics, minicomputers, mainframe computers and the like. Some of the embodiments described herein are practiced in distributed computing environments where tasks are performed by remote processing devices that are linked through a network.

With the above embodiments in mind, it should be understood that some of the embodiments described herein employ various computer-implemented operations involving data stored in computer systems. These operations are those requiring physical manipulation of physical quantities. Any of the operations described herein that form part of the embodiments are useful machine operations. Some of the embodiments described herein also relate to a device or an apparatus for performing these operations. In some embodiments, the apparatus is specially constructed for a special purpose computer. When defined as a special purpose computer, the computer performs other processing, program execution or routines that are not part of the special purpose, while still being capable of operating for the special purpose. In various embodiments, the operations are processed by a general purpose computer selectively activated or configured by one or more computer programs stored in the computer memory, cache, or obtained over a network. When data is obtained over a network, the data is processed by other computers on the network, e.g., a cloud of computing resources.

Some of the embodiments are fabricated as computer-readable code on a non-transitory computer-readable medium. The non-transitory computer-readable medium is any data storage device that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. In some embodiments, the non-transitory computer-readable medium includes computer-readable tangible medium distributed over a network-coupled computer system so that the computer-readable code is stored and executed in a distributed fashion.

Although the method operations were described in a specific order, it should be understood that in some embodiments, other housekeeping operations are performed in between operations, or operations are adjusted so that they occur at slightly different times, or are distributed in a system which allows the occurrence of the processing operations at various intervals associated with the processing, as long as the processing of the overlay operations are performed in the desired way.

In some embodiments, one or more features from any embodiment are combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A system comprising:
a radio frequency (RF) generator configured to generate an RF signal;
an impedance matching circuit connected to the RF generator via an RF cable for receiving the RF signal, wherein the impedance matching circuit is configured to generate a modified signal from the RF signal;
a plasma chamber including an electrode, wherein the electrode is connected to the impedance matching circuit via an RF transmission line for receiving the modified signal; and
a host controller coupled to the RF generator, wherein the host controller is configured to:
receive a variable from the RF generator;
propagate the variable through a model of at least one of the RF cable, the impedance matching circuit, the RF transmission line, and the electrode;
count an output of the model for the variable to generate a count;
determine whether the count meets a count threshold;
generate a statistical value of the variable at the output of the model upon determining that the count meets the count threshold; and
send the statistical value to the RF generator to adjust the variable.

2. The system of claim 1, wherein the variable includes power, or frequency, or a voltage magnitude, or a current magnitude, or a phase between a complex voltage and a complex current, or a complex current, or a complex voltage, or a combination thereof.

3. The system of claim 1, wherein the model is a computer-generated model, wherein to propagate the variable through the model, the host controller is configured to generate a directional sum of a value of the variable and of variable values associated with components of the model.

4. The system of claim 1, wherein the output of the model includes multiple values of the variable.

5. The system of claim 4, wherein the statistical value includes a moving interquartile range of the values, or an interquartile range of the values, or a maximum of the values, or a minimum of the values, or a mean of the values, or a median of the values, or a variance of the values, or a standard deviation of the values, or a moving mean of the values, or a moving median of the values, or a moving variance of the values, or a moving standard deviation of the values, or a mode of the values, or a moving mode of the values, or a combination thereof.

6. A system comprising:
a radio frequency (RF) generator configured to generate an RF signal;
an impedance matching circuit connected to the RF generator via an RF cable for receiving the RF signal, wherein the impedance matching circuit is configured to generate a modified signal from the RF signal;
a plasma chamber including an electrode, wherein the electrode is connected to the impedance matching circuit via an RF transmission line for receiving the modified signal; and
a host controller coupled to the RF generator, wherein the host controller is configured to:
receive data associated with a variable from the RF generator;
generate values output from a computer-generated model based on the received data, wherein the computer-generated model is generated based on at least one of the RF cable, the impedance matching circuit, the RF transmission line, and the electrode;
count an amount of the values output from the computer-generated model;
determine whether the amount exceeds a count threshold;
generate a statistical value from the values output from the computer-generated model in response to determining that the amount exceeds the count threshold;
send the statistical value to the RF generator to adjust the RF signal generated by the RF generator.

7. The system of claim 6, wherein the variable includes power, or frequency, or a voltage magnitude, or a current magnitude, or a phase between a complex voltage and a complex current, or a complex current, or a complex voltage, or a combination thereof.

8. The system of claim 6, wherein the impedance matching circuit matches an impedance of a source with that of a load, wherein the source includes the RF generator and the RF cable, wherein the load includes the plasma chamber and the RF transmission line.

9. The system of claim 6, wherein the plasma chamber includes an upper electrode and a chuck facing the lower electrode, wherein the chuck includes the lower electrode.

10. The system of claim 6, wherein the variable includes a complex voltage and current at a point on the RF cable between the RF generator and the impedance matching circuit.

11. The system of claim 6, wherein the amount includes a number of the values, wherein the statistical value includes a moving interquartile range of the values, or an interquartile range of the values, or a maximum of the values, or a minimum of the values, or a mean of the values, or a median of the values, or a variance of the values, or a standard deviation of the values, or a moving mean of the values, or a moving median of the values, or a moving variance of the values, or a moving standard deviation of the values, or a mode of the values, or a moving mode of the values, or a combination thereof.

12. The system of claim 6, wherein the host controller is configured to decimate the data received after generating the statistical value.

13. A system comprising:
a radio frequency (RF) generator configured to generate an RF signal;
an impedance matching circuit connected to the RF generator via an RF cable for receiving the RF signal, wherein the impedance matching circuit is configured to generate a modified signal from the RF signal;
a plasma chamber including an electrode, wherein the electrode is connected to the impedance matching circuit via an RF transmission line for receiving the modified signal; and
a host controller coupled to the RF generator, wherein the host controller is configured to:
receive data associated with a variable from the RF generator;
generate values at an output of a computer-generated model based on the received data, wherein the computer-generated model is generated based on at least one of the RF cable, the impedance matching circuit, the RF transmission line, and the electrode;
count an amount of the values output from of the computer-generated model;
determine whether the amount exceeds a threshold;
generate a statistical value from the values output from the computer-generated model in response to determining that the amount exceeds the threshold;
determine whether the statistical value is outside a pre-determined range;
adjust the statistical value to be within the pre-determined range in response to determining that the statistical value is outside the pre-determined range; and
send the adjusted statistical value to the RF generator to control the RF generator to adjust the RF signal produced by the RF generator.

14. The system of claim 13, wherein the variable includes power, or frequency, or a voltage magnitude, or a current magnitude, or a phase between a complex voltage and a complex current, or a complex current, or a complex voltage, or a combination thereof.

15. The system of claim 13, wherein the impedance matching circuit matches an impedance of a source with that of a load, wherein the source includes the RF generator and the RF cable, wherein the load includes the plasma chamber and the RF transmission line.

16. The system of claim 13, wherein the plasma chamber includes a chuck and an upper electrode facing the chuck, wherein the chuck includes the lower electrode.

17. The system of claim 13, wherein the variable includes a complex voltage and current at a point on the RF cable.

18. A system comprising:
a radio frequency (RF) generator configured to generate an RF signal;
an impedance matching circuit connected to the RF generator via an RF cable for receiving the RF signal, wherein the impedance matching circuit is configured to generate a modified signal from the RF signal;
a plasma chamber including an electrode, wherein the electrode is connected to the impedance matching circuit via an RF transmission line for receiving the modified signal; and
a host controller coupled to the RF generator, wherein the host controller is configured to:
receive data associated with a variable from the RF generator;
generate values at an output of a computer-generated model based on the received data, wherein the computer-generated model is generated based on at least one of the RF cable, the impedance matching circuit, the RF transmission line, and the electrode;
count an amount of the values output from the computer-generated model;
determine whether the amount exceeds a count threshold;
generate a statistical value from the values output from of the computer-generated model in response to determining that the amount exceeds the count threshold;
determine whether the statistical value is outside a pre-determined extent;
generate an indication of a fault in response to determining that the statistical value is outside the pre-determined extent; and
send the fault indication to the RF generator.

19. The system of claim 18, wherein the host controller is configured to:
determine whether the statistical value is within a pre-determined range;
adjust the statistical value to be within the pre-determined range in response to determining that the statistical value is outside the pre-determined range; and
send the adjusted statistical value to the RF generator to control the RF generator to generate an adjusted RF signal to provide to the plasma chamber via the impedance matching circuit.

20. The system of claim 18, wherein the variable includes power, or frequency, or real portion of load impedance, and or imaginary portion of the load impedance, or a voltage magnitude, or a current magnitude, or a phase between a complex voltage and a complex current, or wafer bias, or ion energy, or plasma potential, or a complex current, or a complex voltage, or load impedance, or a combination thereof.

21. The system of claim 18, wherein the variable includes a complex voltage and current at a point on the RF cable.

* * * * *